(12) United States Patent
Niboshi et al.

(10) Patent No.: US 10,892,432 B2
(45) Date of Patent: Jan. 12, 2021

(54) ORGANIC EL DISPLAY DEVICE, MANUFACTURING METHOD THEREOF, AND LIGHT-EMISSION METHOD THEREOF

(71) Applicant: Sharp Kabushiki Kaisha, Sakai (JP)

(72) Inventors: Manabu Niboshi, Sakai (JP); Shinichi Kawato, Sakai (JP); Tokiyoshi Umeda, Sakai (JP); Yuto Tsukamoto, Sakai (JP); Hiroshi Imada, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 80 days.

(21) Appl. No.: 16/468,079

(22) PCT Filed: Sep. 26, 2017

(86) PCT No.: PCT/JP2017/034678
§ 371 (c)(1),
(2) Date: Jun. 10, 2019

(87) PCT Pub. No.: WO2019/064333
PCT Pub. Date: Apr. 4, 2019

(65) Prior Publication Data
US 2020/0388780 A1   Dec. 10, 2020

(51) Int. Cl.
   *H01L 51/50* (2006.01)
   *H01L 51/52* (2006.01)
   *H01L 51/56* (2006.01)

(52) U.S. Cl.
   CPC ...... *H01L 51/5016* (2013.01); *H01L 51/5004* (2013.01); *H01L 51/5056* (2013.01);
   (Continued)

(58) Field of Classification Search
   None
   See application file for complete search history.

(56) References Cited

U.S. PATENT DOCUMENTS

2011/0248247 A1\* 10/2011 Matsumoto ............ H05B 33/14
                                                    257/40
2014/0340888 A1   11/2014 Ishisone et al.
(Continued)

FOREIGN PATENT DOCUMENTS

JP   2011-233855 A   11/2011
JP   2014-241405 A   12/2014
(Continued)

OTHER PUBLICATIONS

Official Communication issued in International Patent Application No. PCT/JP2017/034678, dated Jan. 9, 2018.

*Primary Examiner* — Daniel Whalen
(74) *Attorney, Agent, or Firm* — Keating & Bennett, LLP

(57) ABSTRACT

An organic EL display device includes a blue pixel, and a second pixel configured to output light having a peak wavelength longer than that of blue light. The blue pixel includes a blue phosphorescent luminescent material containing layer and a blue fluorescent luminescent material containing layer as common layers common to the plurality of pixels, and the second pixel includes a second phosphorescent luminescent material containing layer provided in each of the second pixel, adjacently to the common layers at the side of an anode from the common layers.

17 Claims, 9 Drawing Sheets

(52) U.S. Cl.
CPC ...... *H01L 51/5072* (2013.01); *H01L 51/5096* (2013.01); *H01L 51/5218* (2013.01); *H01L 51/5221* (2013.01); *H01L 51/56* (2013.01)

(56) References Cited

U.S. PATENT DOCUMENTS

| | | | |
|---|---|---|---|
| 2015/0155515 A1* | 6/2015 | Kim | ............... H01L 51/5016 257/40 |
| 2015/0349285 A1 | 12/2015 | Seo et al. | |
| 2016/0079314 A1 | 3/2016 | Seo et al. | |
| 2016/0276602 A1 | 9/2016 | Yoshinaga et al. | |
| 2018/0019428 A1* | 1/2018 | Kawamura | ......... H01L 27/3211 |

FOREIGN PATENT DOCUMENTS

| | | |
|---|---|---|
| JP | 2016-006768 A | 1/2016 |
| JP | 2017-010918 A | 1/2017 |
| WO | 2014/076917 A1 | 5/2014 |
| WO | 2016/129536 A1 | 8/2016 |

* cited by examiner

ORGANIC EL DISPLAY DEVICE, MANUFACTURING METHOD THEREOF, AND LIGHT-EMISSION METHOD THEREOF

TECHNICAL FIELD

The disclosure relates to an organic EL display device, a method of manufacturing the organic EL display device, and a method of light emission of the organic EL display device.

BACKGROUND ART

In the related art, color is regarded important in an organic EL display device. Therefore, organic EL display devices using a fluorescent luminescent material having a wide color gamut for a luminescent material are widely used. However, the fluorescent luminescent material can use only 25% of singlet excitons for light emission.

On the other hand, the internal quantum efficiency of a phosphorescent luminescent material is theoretically 100%. Therefore, in recent years, a display device employing a phosphorescent luminescent material as the luminescent material is being developed, for example, for a white light emitting type device. (for example, see PTL 1).

CITATION LIST

Patent Literature

PTL 1: JP 2014-241405 A (published on Dec. 25, 2014)

SUMMARY

Technical Problem

However, because a blue phosphorescent luminescent material has a shallow blue-color level, there is a problem in color purity in being used for the luminescent material in a display device emitting blue light. Currently, a blue luminescent material capable of achieving both low power consumption and a wide color gamut is not known.

The disclosure is achieved in view of the above problem, and an object thereof is to provide an organic EL display device capable of emitting light having a plurality of colors including blue light with a good balance between luminous efficiency and color level and with a power consumption less than that in the related art, in a pixel emitting blue light, and to provide a method of manufacturing the organic EL display device, and a method of light emission of the organic EL display device.

Solution to Problem

In order to solve the problem described above, an organic EL display device according to one aspect of the disclosure includes a plurality of pixels including a first pixel configured to output blue light, and a second pixel configured to output light having a peak wavelength longer than that of the blue light, and a first electrode, a second electrode, and an organic layer including a light-emitting layer, the organic layer being formed between the first electrode and the second electrode, in each of the pixels. The first pixel includes, as the light-emitting layer, a first phosphorescent luminescent material containing layer including a first phosphorescent luminescent material for emitting blue phosphorescent light, and a first fluorescent luminescent material containing layer including a first fluorescent luminescent material for emitting blue fluorescent light, the first fluorescent luminescent material containing layer being layered adjacently to the first phosphorescent luminescent material containing layer, the first phosphorescent luminescent material containing layer and the first fluorescent luminescent material containing layer are common layers provided in common to the plurality of pixels, the second pixel includes, as the light-emitting layer, a second phosphorescent luminescent material containing layer including a second phosphorescent luminescent material for emitting phosphorescent light having a peak wavelength longer than that of the blue light, the second phosphorescent luminescent material containing layer being provided in each of the second pixel adjacently to the common layers at a first electrode side from the common layers, and while each of the first phosphorescent luminescent material containing layer and the first fluorescent luminescent material containing layer emits light in the first pixel, the second phosphorescent luminescent material containing layer emits light in the second pixel.

In order to solve the problem described above, a method of manufacturing an organic EL display device according to one aspect of the disclosure is a method in which the organic EL display device includes a plurality of pixels including a first pixel configured to emit blue light, and a second pixel configured to emit light having a peak wavelength longer than that of the blue light, and a first electrode, a second electrode, and an organic layer including a light-emitting layer, the organic layer being formed between the first electrode and the second electrode, in each of the pixels. The first pixel includes, as the light-emitting layer, a first phosphorescent luminescent material containing layer including a first phosphorescent luminescent material for emitting blue phosphorescent light, and a first fluorescent luminescent material containing layer including a first fluorescent luminescent material for emitting blue fluorescent light, the first fluorescent luminescent material containing layer being layered adjacently to the first phosphorescent luminescent material containing layer, the first phosphorescent luminescent material containing layer and the first fluorescent luminescent material containing layer are common layers provided in common to the plurality of pixels, the second pixel includes, as the light-emitting layer, a second phosphorescent luminescent material containing layer including a second phosphorescent luminescent material for emitting phosphorescent light having a peak wavelength longer than that of the blue light, the second phosphorescent luminescent material containing layer being provided in each of the second pixel adjacently to the common layers at a first electrode side from the common layers, and while each of the first phosphorescent luminescent material containing layer and the first fluorescent luminescent material containing layer emits light in the first pixel, the second phosphorescent luminescent material containing layer emits light in the second pixel. The method includes a first electrode formation process for forming the first electrode, an organic layer formation process for forming the organic layer, and a second electrode formation process for forming the second electrode. The organic layer formation process includes a second phosphorescent luminescent material containing layer formation process for forming the second phosphorescent luminescent material containing layer in the second pixel by using a vapor deposition mask provided with a mask opening corresponding to the second pixel, and a common layer formation process for forming the common layers by using a vapor deposition mask having a mask opening common to the plurality of pixels, the common layer formation process includes a first phosphorescent luminescent material containing layer formation process for forming the first phosphorescent luminescent material containing layer, and a first fluorescent luminescent material containing layer formation process for forming the first fluorescent luminescent material containing layer, and the second phosphorescent luminescent material containing layer formation process and the common layer formation process are performed in continuation to form the common layers adjacently to the second phosphorescent luminescent material containing layer at a second electrode side from the second phosphorescent luminescent material containing layer, while the first phosphorescent luminescent material containing layer formation process and the first fluorescent luminescent material containing layer formation process are performed in continuation to layer the first phosphorescent luminescent material containing layer and the first fluorescent luminescent material containing layer adjacently.

In order to solve the problem described above, a method of light emission of an organic EL display device according to one aspect of the disclosure is a method in which the organic EL display device includes a plurality of pixels including a first pixel configured to output blue light, and a second pixel configured to output light having a peak wavelength longer than that of the blue light, and a first electrode, a second electrode, and an organic layer including a light-emitting layer, the organic layer being formed between the first electrode and the second electrode in each of the pixels. The first pixel includes, as the light-emitting layer, a first phosphorescent luminescent material containing layer including a first phosphorescent luminescent material for emitting blue phosphorescent light, and a first fluorescent luminescent material containing layer including a first fluorescent luminescent material for emitting blue fluorescent light, the first fluorescent luminescent material containing layer being layered adjacently to the first phosphorescent luminescent material containing layer, the first phosphorescent luminescent material containing layer and the first fluorescent luminescent material containing layer are common layers provided in common to the plurality of pixels, and the second pixel includes, as the light-emitting layer, a second phosphorescent luminescent material containing layer including a second phosphorescent luminescent material for emitting phosphorescent light having a peak wavelength longer than that of the blue light, the second phosphorescent luminescent material containing layer being provided in each of the second pixel adjacently to the common layers at a first electrode side from the common layers. In the first pixel, a triplet exciton is generated in the first phosphorescent luminescent material containing layer while a singlet exciton is generated in the first fluorescent luminescent material containing layer, and light containing light produced when the triplet exciton generated in the first phosphorescent luminescent material containing layer returns to a ground state, and light produced when the singlet exciton generated in the first fluorescent luminescent material containing layer returns to a ground state is emitted, and in the second pixel, a triplet exciton is generated in the second phosphorescent luminescent material containing layer, and phosphorescent light produced when the triplet exciton generated in the second phosphorescent luminescent material containing layer returns to a ground state is emitted, while by using a material having an HOMO level deeper than that of the second phosphorescent luminescent material in the material included in the layer at the first electrode side among the common layers, movement of a hole from the second phosphorescent luminescent material containing layer to the common layers is blocked.

Advantageous Effects of Disclosure

According to one aspect of the disclosure, it is possible to provide an organic EL display device capable of emitting light having a plurality of colors including blue light with a good balance between luminous efficiency and color level and with a power consumption less than that in the related art, in a pixel emitting blue light, and to provide a method of manufacturing the organic EL display device, and a method of light emission of the organic EL display device.

DESCRIPTION OF EMBODIMENTS

First Embodiment

A description will be given of one embodiment of the disclosure, on the basis of FIG. 1 to FIGS. 6A to 6D.

Schematic Configuration of Organic EL Display Device

Figure 5:
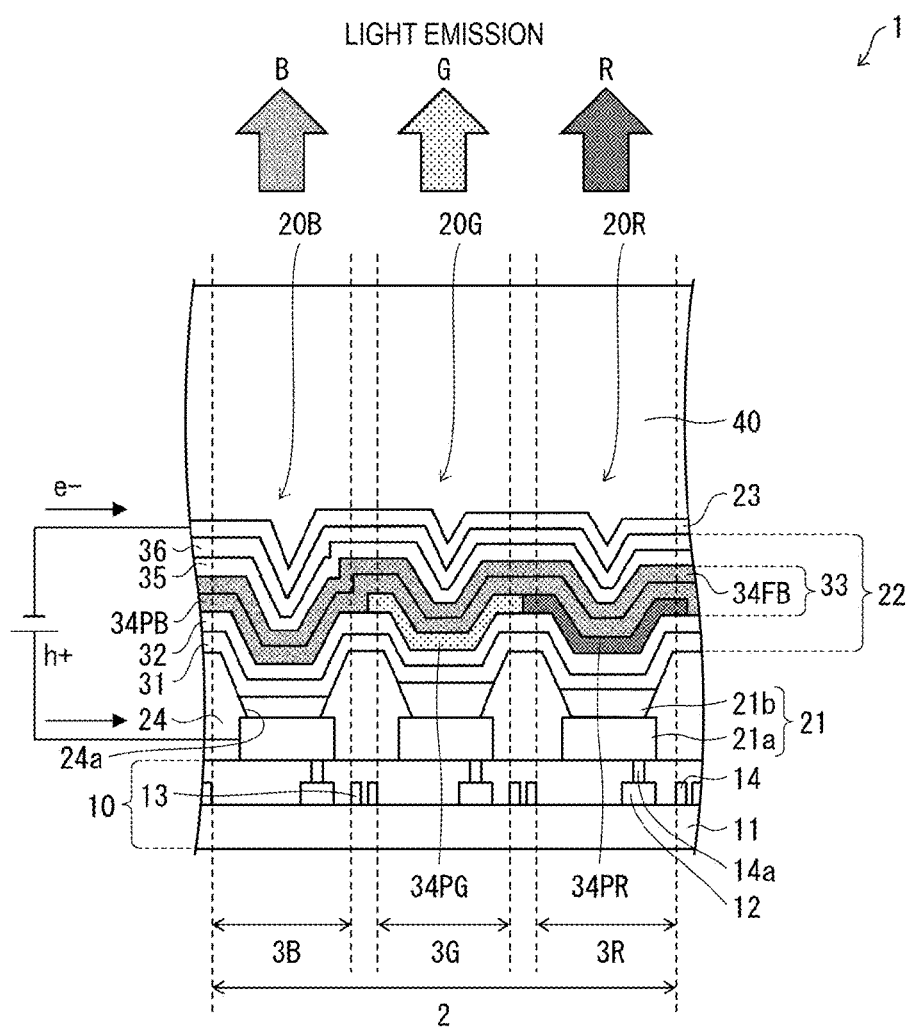
FIG. 5 is a cross-sectional view illustrating a schematic configuration of main portions of the organic EL display device according to the first embodiment of the disclosure.

FIG. 5 is a cross-sectional view illustrating a schematic configuration of main portions of an organic EL display device 1 according to the present embodiment.

As illustrated in FIG. 5, the organic EL display device 1 has a plurality of pixels 3 outputting light having different colors (in other words, light having different peak wavelengths of photoluminescence emission spectrum). The pixels 3 include a blue pixel 3B (a first pixel) outputting blue light, and a pixel (a second pixel) outputting light having a peak wavelength longer than the peak wavelength of the blue light.

The blue pixel 3B is provided with a blue phosphorescent luminescent material containing layer 34PB (first phosphorescent luminescent material containing layer), and a blue fluorescent luminescent material containing layer 34FB (first fluorescent luminescent material containing layer) as a light-emitting layer. The blue phosphorescent luminescent material containing layer 34PB includes a blue phosphorescent luminescent material (first phosphorescent luminescent material) for emitting blue phosphorescent light. The blue fluorescent luminescent material containing layer 34FB includes a blue fluorescent luminescent material (first fluorescent luminescent material) for emitting blue fluorescent light.

On the other hand, the second pixel is provided with a second phosphorescent luminescent material containing layer including a second phosphorescent luminescent material for emitting phosphorescent light having a peak wavelength longer than that of the blue light, as a light-emitting layer. The light-emitting layers will be described later.

The organic EL display device 1 according to the present embodiment includes, as the second pixel, a green pixel 3G outputting green light, and a red pixel 3R outputting red light. As a result, the organic EL display device 1 displays a full color image.

Figure 6A:
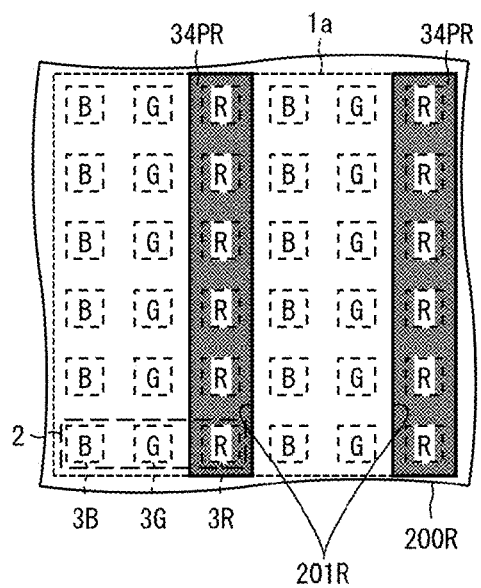
FIGS. 6A to 6D are plan views illustrating, in layering order, a method of layering each luminescent material containing layer included in the light-emitting layer unit of the organic EL display device according to the first embodiment of the disclosure.

In the present embodiment, one picture element 2 is formed by the pixels 3 in three colors, that is, the blue pixel 3B, the green pixel 3G, and the red pixel 3R. As illustrated in FIG. 6A described later, a plurality of picture elements 2 are provided in matrix in a display region 1a.

A blue organic EL element 20B being an organic EL element 20 emitting blue (B) light is arranged in the blue pixel 3B. A green organic EL element 20G being an organic EL element 20 emitting green (G) light is arranged in the green pixel 3G. A red organic EL element 20R being an organic EL element 20 emitting red (R) light is arranged in the red pixel 3R.

The organic EL display device 1 has a configuration in which the plurality of organic EL elements 20 having each color are provided, for example, on a Thin Film Transistor (TFT) substrate 10. The plurality of organic EL elements 20 are covered with a sealing film 40. Note that a cover body (not illustrated) may be provided on the sealing film 40, for example, via an adhesive layer (not illustrated).

The TFT substrate 10 is a circuit substrate in which a TFT circuit including a TFT 12 (drive element) and a wiring line 13 is formed. The TFT substrate 10 includes a support body 11 having insulating properties, the TFT circuit provided on the support body 11, and a flattening film 14 covering the TFT circuit.

The support body 11 may be a flexible layered film in which, for example, a lower surface film, a resin layer, and a barrier layer (not illustrated) are provided in this order, and may be a glass substrate, a plastic substrate, or a plastic film.

A known TFT can be employed for the TFT 12. The wiring line 13 includes a plurality of gate wiring lines and a plurality of source wiring lines connected to the TFT 12. The gate wiring lines and the source wiring lines are arranged to orthogonally intersect to each other. The region surrounded by the gate wiring lines and the source wiring lines is the pixel 3.

The flattening film 14 is an organic insulating film made of a photosensitive resin such as an acryl resin or a polyimide resin. The flattening film 14 levels convex and recess on the TFT circuit.

As illustrated in FIG. 5, the organic EL element 20 has a configuration in which an organic EL layer 22 is held by an anode electrode 21 (first electrode) and a cathode electrode 23 (second electrode).

Note that hereafter, a case in which the first electrode is a lower layer electrode, the second electrode is an upper layer electrode, the first electrode is the anode electrode 21, the second electrode is the cathode electrode 23, and the anode electrode 21, the organic EL layer 22, and the cathode electrode 23 are layered in this order from the lower layer side will be explained as an example. However, the present embodiment is not limited thereto and may have a configuration in which the first electrode is the cathode electrode 23, the second electrode is the anode electrode 21, and the cathode electrode 23, the organic EL layer 22, and the anode electrode 21 are layered in this order from the lower layer side. In this case, the layering order or the carrier transport property (the hole transport property and the electron transport property) of each function layer constituting the organic EL layer 22 is reversed. Further, the component materials of the first electrode and the second electrode are also reversed.

In the present embodiment, the anode electrode 21 is an electrode (pattern anode electrode) formed in an island-shaped pattern for each pixel 3. Further, the cathode electrode 23 is a solid-like electrode (common cathode electrode) provided in common for all pixels 3 (the common cathode).

An end portion of the anode electrode 21 is covered with an edge cover 24. Each anode electrode 21 is connected to the TFT 12 via a contact hole 14a provided in the flattening film 14.

The edge cover 24 is an insulating layer, and includes for example, a photosensitive resin. The edge cover 24 prevents a short circuit of the cathode electrode 23 that may be caused by concentration of the electrodes or a decrease in thickness of the organic EL layer 22 at the end portion of the anode electrode 21. Moreover, the edge cover 24 also functions as a pixel separation film to prevent current leakage between the adjacent pixels 3.

The edge cover 24 is provided with an opening 24a for each pixel 3. A part of the anode electrode 21 and the organic EL layer 22 exposed by the opening 24a is a light-emitting region of each pixel 3, and the other region is a non emissive region.

A photosensitive resin can be used for the edge cover 24. A transparent conductive film of indium tin oxide (ITO), indium zinc oxide (IZO) or the like, or a metal such as gold (Au), platinum (Pt), and nickel (Ni) can be used for the anode electrode 21, for example. To inject electrons into the light-emitting layer, a metal with a small work function, such as lithium (Li), cerium (Ce), barium (Ba), and aluminum (Al), or an alloy containing such a metal, such as a magnesium alloy (MgAg or the like), or an aluminum alloy (AlLi, AlCa, AlMg or the like) is used for the cathode electrode 23.

Light generated in the light-emitting layer is extracted from one electrode side out of the anode electrode 21 or the cathode electrode 23. A transparent or semitransparent light-transmissive electrode is used as the electrode at the side where the light is extracted. A reflective electrode is used as the electrode at the side where the light is not extracted. The reflective electrode may be formed of a reflective electrode material, or may be an electrode having a reflective layer.

Further, each of the anode electrode 21 and the cathode electrode 23 may be formed of a single layer, or may have a layered structure made of a plurality of electrode materials.

Therefore, in a case where the organic EL element 20 is a top-emitting organic EL element, then as illustrated in FIG. 5, the anode electrode 21 may have a layered structure configured by a reflective electrode 21a (the reflective layer) and a light-transmissive electrode 21b.

Exemplary reflective electrode materials include a black electrode material such as tantalum (Ta) or carbon (C), a reflective metal electrode material such as Al, Ag, gold (Au), Al—Li alloy, Al-neodymium (Nd) alloy, or Al-silicon (Si) alloy. As for the light-transmissive electrode, for example, the transparent conductive film described above may be used, or a semitransparent electrode having a transreflective layer made of a thin film of the metal described above may be used.

The reflective electrode 21a having the same film thickness for each pixel 3 is independently formed and is connected to a drain electrode of the TFT 12 in each pixel 3. On the other hand, the light-transmissive electrode 21b is formed to have a thickness corresponding to a peak wavelength of light in a wavelength region of each color output from each pixel 3 so that a distance between the reflective electrode 21a (the reflective layer) and the transreflective layer (the cathode electrode 23) is a distance to increase the intensity of the peak wavelength of the light in the wavelength region of each color. In other words, the distance between the reflective layer and the transreflective layer is an optical path length at which the peak wavelength of light having the color output from each pixel 3 resonates. Thereby, the color purity of light output from each pixel 3 is enhanced, and the color level and luminous efficiency of light emission are improved.

The organic EL layer 22 includes at least a light-emitting layer, and is a function layer composed of an organic layer. In the present embodiment, layers provided between the anode electrode 21 and the cathode electrode 23 are collectively referred to as an organic EL layer 22.

The organic EL layer 22 has a configuration in which a hole injection layer (HIL) 31, a hole transport layer (HTL) 32, a light-emitting layer unit 33 including a plurality of luminescent material containing layers 34, an electron transport layer (ETL) 35, and an electron injection layer (EIL) 36 are layered in this order from the anode electrode 21 side.

Note that in FIG. 5, a case in which the lower layer electrode is the anode electrode 21 and the upper layer electrode is the cathode electrode 23 is illustrated as an example. However, the present embodiment is not limited thereto, and the lower layer electrode may be the cathode electrode 23 and the upper layer electrode may be the anode electrode 21. In this case, the layering order or the carrier transport property (the hole transport property and the electron transport property) of each function layer constituting the organic EL layer 22 is reversed. Similarly, the component materials of the anode electrode 21 and the cathode electrode 23 are also reversed.

The hole injection layer 31, the hole transport layer 32, the electron transport layer 35, and the electron injection layer 36 are, for example, formed in a solid state across the entire display region extending over all the pixels 3 to cover the upper surface of the edge cover 24 as a common layer common to all the pixels 3. However, the present embodiment is not limited to the above configuration. The hole injection layer 31, the hole transport layer 32, the electron transport layer 35, and the electron injection layer 36 may be provided in an island shape for each pixel 3.

The light-emitting layer unit 33 of the blue pixel 3B is formed of a two-layered luminescent material containing layer 34 including a blue phosphorescent luminescent material containing layer 34PB (EML-PB) and a blue fluorescent luminescent material containing layer 34FB (EML-FB). In the blue pixel 3B, the blue phosphorescent luminescent material containing layer 34PB and the blue fluorescent luminescent material containing layer 34FB emit light respectively. That is, in the blue pixel 3B, each of the blue phosphorescent luminescent material containing layer 34PB and the blue fluorescent luminescent material containing layer 34FB are used as a light-emitting layer.

The blue fluorescent luminescent material containing layer 34FB is layered on and adjacent to the blue phosphorescent luminescent material containing layer 34PB. The blue phosphorescent luminescent material containing layer 34PB and the blue fluorescent luminescent material containing layer 34FB are formed in a solid state across the entire display region extending over all the pixels 3 as a common layer common to all the pixels 3.

On the other hand, the green pixel 3G has a green phosphorescent luminescent material containing layer 34PG (second phosphorescent luminescent material containing layer, EML-PG) as a light-emitting layer. The green phosphorescent luminescent material containing layer 34PG includes a green phosphorescent luminescent material (second phosphorescent luminescent material) for emitting green phosphorescent light having a peak wavelength longer than the peak wavelength of the blue phosphorescent light and the peak wavelength of the blue fluorescent light. The green phosphorescent luminescent material containing layer 34PG is provided in an island shape for each green pixel 3G.

Further, the red pixel 3R has a red phosphorescent luminescent material containing layer 34PR (second phosphorescent luminescent material containing layer, EML-PR) as a light-emitting layer. The red phosphorescent luminescent material containing layer 34PR includes a red phosphorescent luminescent material (second phosphorescent luminescent material) for emitting red phosphorescent light having a peak wavelength longer than the peak wavelength of the blue phosphorescent light, the peak wavelength of the blue fluorescent light, and the peak wavelength of the green phosphorescent light. The red phosphorescent luminescent material containing layer 34PR is provided in an island shape for each red pixel 3R.

Each of the green phosphorescent luminescent material containing layer 34PG and the red phosphorescent luminescent material containing layer 34PR is provided adjacent to the blue phosphorescent luminescent material containing layer 34PB and the blue fluorescent luminescent material containing layer 34FB at the anode electrode 21 side from the blue phosphorescent luminescent material containing layer 34PB and the blue fluorescent luminescent material containing layer 34FB.

Therefore, the light-emitting layer unit 33 of the green pixel 3G has a configuration in which the green phosphorescent luminescent material containing layer 34PG, the blue phosphorescent luminescent material containing layer 34PB, and the blue fluorescent luminescent material containing layer 34FB are layered adjacently to each other in this order from the anode electrode 21 side.

Further, the light-emitting layer unit 33 of the red pixel 3R has a configuration in which the red phosphorescent luminescent material containing layer 34PR, the blue phosphorescent luminescent material containing layer 34PB, and the blue fluorescent luminescent material containing layer 34FB are layered adjacently to each other in this order from the anode electrode 21 side.

Figure 6B:
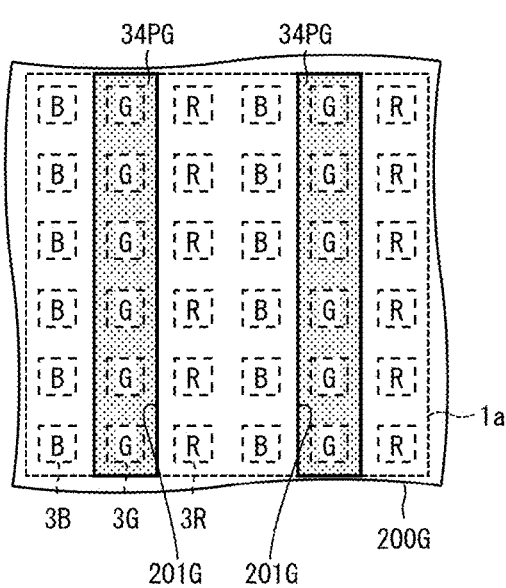

Each of the luminescent material containing layers 34 in the light-emitting layer unit 33 is formed of two components having a host material and a luminescent material (a luminescent dopant material) as illustrated in FIGS. 6A and 6B described later. However, the embodiment is not limited thereto, and each of the luminescent material containing layers 34 may be formed of a luminescent material alone. Further, the material having the largest content percentage among the materials (components) in each of the luminescent material containing layers 34 may be a host material or a luminescent material.

The host material is a material in which holes and electrons can be injected, and has a function of allowing a luminescent material to emit light by holes and electrons that are transported and recombine with each other within a molecule thereof. In a case where the luminescent material containing layer 34 includes the host material, the host material has a carrier transport function and an exciton generation function, and the luminescent material has a light emission function. The carrier transport function and the light emission function in the luminescent material containing layer 34 are separated functionally, and a small amount of a luminescent material with a high photoluminescence quantum yield is doped in the luminescent material containing layer 34 so that an exciton that transfers energy to the luminescent material quickly emits light to achieve an effective organic EL light emission. In a case where a host material is used, the luminescent material is uniformly dispersed in the host material.

When a host material is used, it is preferable to employ a host material having a triplet excitation level ($T_1$ level) higher than that of the blue phosphorescent luminescent material and having a highest occupied molecular orbital level (HOMO level) deeper than that of the blue phosphorescent luminescent material, as the host material of the blue phosphorescent luminescent material containing layer 34PB. Similarly, it is preferable to employ a host material having a $T_1$ level higher than that of the green phosphorescent luminescent material and having an HOMO level deeper than that of the green phosphorescent luminescent material, as the host material of the green phosphorescent luminescent material containing layer 34PG. Further, it is preferable to employ a host material having a $T_1$ level higher than that of the red phosphorescent luminescent material and having an HOMO level deeper than that of the red phosphorescent luminescent material, as the host material of the red phosphorescent luminescent material containing layer 34PR. Thus, in each of the phosphorescent luminescent material containing layers, holes can be efficiently injected into the phosphorescent luminescent material.

Further, it is preferable to employ a host material having a singlet excitation level ($S_1$ level) higher than that of the blue fluorescent luminescent material and having a lowest unoccupied molecular orbital level (LUMO level) shallower than that of the blue fluorescent luminescent material, as the host material of the blue fluorescent luminescent material containing layer 34FB. Thus, in the blue fluorescent luminescent material containing layer 34FB, electrons can be efficiently injected into the blue fluorescent luminescent material.

Further, in the present embodiment, the hole transport property and the electron transport property of each layer in the organic EL layer 22 are adjusted to generate excitons in each of the blue phosphorescent luminescent material containing layer 34PB and the blue fluorescent luminescent material containing layer 34FB in the blue pixel 3B.

Examples of the host material with the hole transport property include hole transport materials such as 4,4'-bis[N-phenyl-N-(3"-methylphenyl)amino]biphenyl (TPD), 9,10-di (2-naphthyl)anthracene (ADN), 1,3-bis(carbazole-9-yl)benzene (mCP), 3,3'-di(9H-carbazole-9-yl)biphenyl (mCBP), and 4,4',4"-tris-(N-carbazolyl)-triphenylamine (TCTA).

Examples of the host material with the electron transport property include electron transporting materials such as 2,9-dimethyl-4,7-diphenyl-1,10-phenanthroline (BCP), bis [(2-diphenylphosphoryl)phenyl]ether (DPEPO), 4,4'-bis(2, 2-diphenylvinyl)-1,1'-biphenyl (DPVBi), 2,2',2"-(1,3,5-benzinetriyl)-tris(1-phenyl-1-H-benzimidazolyl) (TPBi), and bis(2-methyl-8-quinolinolate)-4-(phenylphenolate)aluminum (BAlq) can be cited as the host material with.

Examples of the host material with bipolar transport property include bipolar transport materials such as 4,4'-bis (9-carbazoyl)-biphenyl (CBP).

An example of the blue fluorescent luminescent material includes a fluorescent luminescent material emitting blue light, such as 2,5,8,11-tetra-tert-butylperylene (TBPe), bis [4-(9,9-dimethyl-9,10-dihydroacridine)phenyl]sulfone (DMAC-DPS), perylene, 4,5-bis(carbazole-9-yl)-1,2-dicyanobenzene (2CzPN), and 4,4'-bis(9-ethyl-3-carbazovinylene)-1,1'-biphenyl (BCzVBi).

Examples of the red phosphorescent luminescent material include Tris(1-phenylisoquinoline)iridium(III) (Ir(piq)3), bis(2-benzo[b]thiophene-2-yl-pyridine) (acetylacetonate) iridium (III) (Ir(btp)2(aca)) ((btp) 2 (acac), platinum(II)-octaethyl-porphyrin (PtOEP), and bis(10-hydroxybenzo[h] quinolinate)beryllium (Bebq2).

Examples of the green phosphorescent luminescent material includes Tris(2-phenylpyridyl)iridium(III) (Ir(PPy)3), and bis(2-phenylpyridine) (acetylacetonate)iridium(III) (Ir (PPy)2(acac)).

Examples of the blue phosphorescent luminescent material include oxadiazole dimer dye (Bis-DAPDXP), spiro compound (2,2',7,7'-tetrakis(2,2'-diphenylvinyl)spiro-9,9'-bifluorene (Spiro-DPVBi), tetraphenyl butadiene) (TPB), pentaphenylcyclopentadiene (PPCP), triphenylamine (TPA), and bis[2-(4,6-difluorophenyl)pyridinate-N, C2']iridium picolinate (Flrpic).

Further, in the present embodiment, out of the blue phosphorescent luminescent material containing layer 34PB and the blue fluorescent luminescent material containing layer 34FB, the blue fluorescent luminescent material containing layer 34FB located at the cathode electrode 23 side desirably includes a material having an HOMO level shallower than the blue phosphorescent luminescent material containing layer 34PB located at the anode electrode 21 side, and desirably includes a material having a LUMO level shallower than the blue phosphorescent luminescent material containing layer 34PB.

Further, out of the blue phosphorescent luminescent material containing layer 34PB and the blue fluorescent luminescent material containing layer 34FB, the material included in the blue phosphorescent luminescent material containing layer 34PB located at the anode electrode 21 side desirably has an HOMO level deeper than the green phosphorescent luminescent material and the red phosphorescent luminescent material.

Further, out of the blue phosphorescent luminescent material containing layer 34PB and the blue fluorescent luminescent material containing layer 34FB, the triplet excitation level of the blue phosphorescent luminescent material included in the blue phosphorescent luminescent material containing layer 34PB located at the anode electrode 21 side is desirably higher than the triplet excitation level of the green phosphorescent luminescent material and the triplet excitation level of the red phosphorescent luminescent material.

Note that the ratio (the dope concentration) of each of the phosphorescent luminescent materials in each of the phosphorescent luminescent material containing layers can be set arbitrarily according to the type or the like of the phosphorescent luminescent material, and can include, but not limited to, a range from 1 to 40 mass %. Further, the ratio (the dope concentration) of the blue fluorescent luminescent material in the blue fluorescent luminescent material containing layer 34FB can be set arbitrarily according to the type or the like of the blue fluorescent luminescent material, and can include, but not limited to, a range from 1 to 40 mass %.

In the present embodiment, function layers other than the luminescent material containing layers included in the light-emitting layer unit 33 are not essential to the organic EL layer 22, and may be appropriately formed according to the required properties of the organic EL element 20.

The hole injection layer 31 includes a hole injection material and has a function to increase the hole injection efficiency to the luminescent material containing layer used as a light-emitting layer. The hole transport layer 32 includes a hole transport material and has a function to increase the hole transport efficiency to the light-emitting layer. The hole injection layer 31 and the hole transport layer 32 may be formed as mutually independent layers, or may be integrated together as a hole injection-cum-transport layer. Further, it is not necessary that both the hole injection layer 31 and the hole transport layer 32 be provided, and only either one (for example, only the hole transport layer 32) may be provided.

A known material can be used as a material for the hole injection layer 31, the hole transport layer 32, or a hole injection-cum-transport layer, that is, as the hole injection material or the hole transport material. Examples of the material include linear or heterocyclic conjugated monomers, oligomers, or polymers such as naphthalene, anthracene, azatriphenylene, fluorenone, hydrazone, stilbene, triphenylene, benzine, styrylamine, triphenylamine, porphyrins, triazole, imidazole, oxadiazole, oxazole, polyarylalkane, phenylenediamine, arylamine, and derivative thereof, a thiophene-based compound, a polysilane-based compound, a vinyl carbazole-based compound, and an aniline-based compound. More specifically, for example, N,N'-di(naphthalene-1-yl)-N,N'-diphenyl-benzidine (α-NPD), 2,3,6,7,10,11-hexacyano-1,4,5,8,9,12-hexaazatriphenylene (HAT-CN), 1,3-bis(carbazole-9-yl)benzene (mCP), di-[4-(N,N-ditolyl-amino)-phenyl]cyclohexane (TAPC), 9,10-diphenylanthracene-2-sulfonate (DPAS), N,N'-diphenyl-N,N'-(4-(di(3-tolyl)amino)phenyl)-1,1'-biphenyl-4,4'-diamine (DNTPD), iridium(M)tris[N,N'-diphenylbenzoimidazole-2-ylidene-C2,C2'](Ir(dpbic)3), 4,4',4''-tris-(N-carbazolyl)-triphenylamine (TCTA), 2,2-bis(p-trimellitic oxyphenyl)propanoic anhydride (BTPD), bis[4-(p,p-ditolylamino)phenyl]diphenylsilane (DTASi), or the like, are used.

For the hole injecting layer 31, the hole transport layer 32, or the hole injection-cum-transport layer, an intrinsic hole-injecting material or an intrinsic hole-transporting material that is not doped with an impurity may be used. Alternatively, the material may be doped with an impurity to enhance the electrical conductivity.

The electron injection layer 36 includes an electron injection material and has a function to increase the electron injection efficiency to the light-emitting layer. The electron transport layer 35 includes an electron transporting material and has a function to increase the electron transport efficiency to the light-emitting layer. The electron injection layer 36 and the electron transport layer 35 may be formed as mutually independent layers, or may be integrated together as an electron injection-cum-transport layer. It is not necessary that both the electron injection layer 36 and the electron transport layer 35 be provided, and only either one (for example, only the electron transport layer 35) may be provided.

A known material can be used as a material for the electron injection layer 36, the electron transport layer 35, or the electron injection-cum-transport layer, that is, as the electron injection material or the electron transporting material. Examples of the material include quinoline, perylene, phenanthroline, bisstyryl, pyrazine, triazole, oxazole, oxadiazole, fluorenone, and derivatives and metal complexes thereof, and lithium fluoride (LiF). More specific examples thereof include bis[(2-diphenylphosphoryl)phenyl]ether (DPEPO), 4,7-diphenyl-1,10-phenanthroline (Bphen), 3,3'-bis(9H-carbazole-9-yl)biphenyl (mCBP), 2,9-dimethyl-4,7-diphenyl-1,10-phenanthroline (BCP), 1,3,5-tris(N-phenyl-benzoimidazole-2-yl)benzene (TPBI), 3-phenyl-4(1'-naphthyl)-5-phenyl-1,2,4-triazole (TAZ), 1,10-phenanthroline, Alq(tris(8-hydroxyquinoline)aluminum), LiF, etc.

The sealing film 40 configured to seal the organic EL elements 20 is provided on the cathode electrode 23 in the organic EL element 20. The sealing layer 40 protects the cathode electrode 23 serving as the upper electrode, in addition to preventing external oxygen and moisture from infiltrating into each organic EL element 20. The sealing layer 40 is provided to cover all the organic EL elements 20.

The sealing film 40 may be formed of an inorganic layer, and may include an inorganic layer (inorganic sealing layer) and an organic layer (organic sealing layer). For example, as an example, the sealing film 40 may include an organic layer, and a first inorganic layer and second inorganic layer that sandwich the organic layer. The inorganic layer has a moisture-proof function to inhibit the infiltration of moisture, and functions as a barrier layer to inhibit deterioration of the organic EL elements 20 caused by moisture or oxygen. The organic layer is used as a buffer layer (stress relief layer). The organic layer relaxes the stress of the inorganic layer having a large film stress, and fills steps and foreign matters on the surface of the organic EL elements 20 to level the surface and fill up a pin hole.

Examples of the inorganic layer include silicon oxide film, silicon nitride film, silicon oxynitride film, and a layered film thereof. An example of the organic layer includes a photosensitive resin such as an acrylic resin, an epoxy resin, and a silicon resin.

Note that as described earlier, a cover body (not illustrated) may be provided on the sealing film 40 via an adhesive layer (not illustrated). The cover body is a function layer having at least one of a protection function, an optical compensation function, and a touch sensor function. The cover body may be a protective film functioning as a support body when the carrier substrate such as a glass substrate is peeled, may be a hard coat layer such as a hard coat film, and may be a functional film such as a polarizing film and a touch sensor film.

Manufacturing Method of Organic EL Display Device 1

Next, a method of manufacturing the organic EL display device 1 will be described below with reference to FIG. 5 and FIGS. 6A to 6D.

FIGS. 6A to 6D are plan views illustrating a method of layering each of the luminescent material containing layers 34 (that is, the red phosphorescent luminescent material containing layer 34PR, the green phosphorescent luminescent material containing layer 34PG, the blue phosphorescent luminescent material containing layer 34PB, and the blue florescent luminescent material containing layer 34FB) constituting the light-emitting layer unit 33 of the organic EL display device 1 according to the present embodiment. Note that in FIGS. 6A to 6D, for convenience of illustration, the number of the pixel 3 (that is, the blue pixel 3B, the green pixel 3G, and the red pixel 3R) is omitted.

A manufacturing process of the organic EL display device 1 according to the present embodiment includes a TFT substrate preparation process for preparing the TFT substrate 10, an organic EL element preparation process (an organic layer formation process) for forming the organic EL element 20 on the TFT substrate 10, and a sealing process for sealing the organic EL element 20 prepared in the organic EL element preparation process with the sealing film 40.

Further, the organic EL element preparation process includes, for example, an anode formation process, a hole injection layer formation process, a hole transport layer formation process, a red phosphorescent luminescent material containing layer formation process (a second phosphorescent luminescent material containing layer formation process), a green phosphorescent luminescent material containing layer formation process (a second phosphorescent luminescent material containing layer formation process), a blue phosphorescent luminescent material containing layer formation process (a common layer formation process, a first phosphorescent luminescent material containing layer formation process), a blue fluorescent luminescent material containing layer formation process (a common layer formation process, a first fluorescent luminescent material containing layer formation process), an electron transport layer formation process, an electron injection layer formation process, and a cathode formation process.

In the present embodiment, the organic EL element preparation process is performed, for example, in this order. In the present embodiment, for example, the green phosphorescent luminescent material containing layer formation process and the blue phosphorescent luminescent material containing layer formation process are performed in continuation so that the blue phosphorescent luminescent material containing layer 34PB is formed adjacently to the green phosphorescent luminescent material containing layer 34PG at the cathode electrode 23 side from the green phosphorescent luminescent material containing layer 34PG. Further, in the present embodiment, the blue phosphorescent luminescent material containing layer formation process and the blue fluorescent luminescent material containing layer formation process are performed in continuation so that the blue phosphorescent luminescent material containing layer 34PB and the blue fluorescent luminescent material containing layer 34FB are layered adjacently to each other. Hereinafter, each of the processes will be described.

Figure 2:
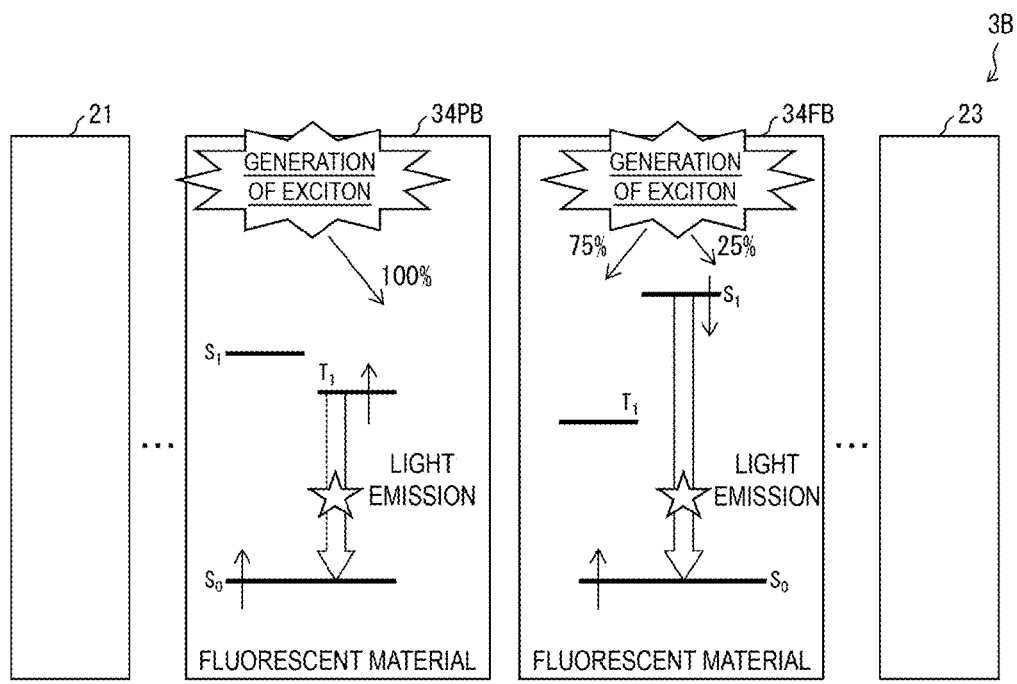
FIG. 2 is a diagram explaining a light emission mechanism in a blue pixel of the organic EL display device according to the first embodiment of the disclosure.

First, as illustrated in FIG. 2, a photosensitive resin is applied on the support body 11 on which a TFT circuit including the TFT 12 and the wiring line 13 is formed, and patterning is performed by a photolithography technique to form the flattening film 14 on the support body 11. Next, a contact hole 13a for electrically connecting the anode electrode 21 to the TFT 12 is formed in the flattening film 14. As a result, the TFT substrate 10 is prepared (the TFT substrate preparation process).

Next, the organic EL element 20 is prepared on the TFT substrate 10 thus formed (the organic EL element preparation process).

In the organic EL element preparation process, first, the anode electrode 21 is formed on the TFT substrate 10 (the anode formation process). The anode formation process according to the present embodiment includes a reflective electrode formation process for forming a reflective electrode 21a on the TFT substrate 10, and a light-transmissive electrode formation process for forming a light-transmissive electrode 21b on the reflective electrode 21a.

In the reflective electrode formation process, the reflective electrode 21a is pattern formed with a predetermined thickness on the TFT substrate 10 by a known method. In the light-transmissive electrode formation process, light-transmissive electrodes 21b of different thicknesses are pattern formed on the reflective electrode 21a for each pixel 3.

The organic EL element 20 according to the present embodiment is a microcavity (micro resonator) type organic EL element. In such an organic EL element, the emitted light is multiply reflected between the anode electrode 21 and the cathode electrode 23 and resonated to make the emission spectrum steep, and the emission intensity of a specific wavelength is amplified. In the example illustrated in FIG. 5, the thickness of the light-transmissive electrode 21b is set for each pixel 3 to change the optical path length for each pixel 3. In the present embodiment, the anode electrodes 21 having a layer thickness different in each pixel 3 are thus formed in matrix on the TFT substrate 10.

Next, the edge cover 24 is pattern formed to cover the end portion of the anode electrode 21. By the above processes, the anode electrode 21 separated by the edge cover 24 is prepared for each pixel 3.

Next, the hole injection layer 31 and the hole transport layer 32 are vapor-deposited in this order on the entire surface of the display region 1a on the TFT substrate 10 on which the anode electrode 21 is formed using an open mask, for example (the hole injection layer formation process and the hole transport layer formation process). However, as described earlier, the hole injection layer 31 and the hole transport layer 32 are not essential, and may be formed in an island shape for each pixel 3.

Next, as illustrated in FIG. 6A, the red phosphorescent luminescent material containing layer 34PR is formed on the red pixel 3R (the red phosphorescent luminescent material containing layer formation process). The red phosphorescent luminescent material containing layer 34PR is formed in a stripe-like island shape on the hole transport layer 32 of the red pixel 3R by separately patterning vapor deposition using a vapor deposition mask 200R in which a mask opening 201R corresponding to the red pixel 3R is provided.

Thereafter, as illustrated in FIG. 6B, the green phosphorescent luminescent material containing layer 34PG is formed in the green pixel 3G (the green phosphorescent luminescent material containing layer formation process). The green phosphorescent luminescent material containing layer 34PG is linear deposited in a stripe-like island shape on the hole transport layer 32 of the green pixel 3G by separately patterning vapor deposition using a vapor deposition mask 200G in which a mask opening 201G corresponding to the green pixel 3G is provided.

Note that the red phosphorescent luminescent material containing layer formation process and the green phosphorescent luminescent material containing layer formation process may be performed in the reverse order, but are preferably performed in this order. In a case where the processes are performed in this order, for example, like the host material of the green phosphorescent luminescent material containing layer 34PG (EML-PG) illustrated in FIG. 6A, in a case where the material with the largest content percentage among the materials in the green luminescent material containing layer 34PG is the hole transport material, then even if the red phosphorescent luminescent material enters the pixel 3G, and the red phosphorescent luminescent material containing layer 34PR is formed below the green phosphorescent luminescent material containing layer 34PG, the electrons do not reach up to the red phosphorescent luminescent material containing layer 34PR. Thus, a red color mixing is not generated in the pixel 3G. Therefore, in this case, a vapor deposition margin for preventing color mixing can be reduced.

Figure 6C:
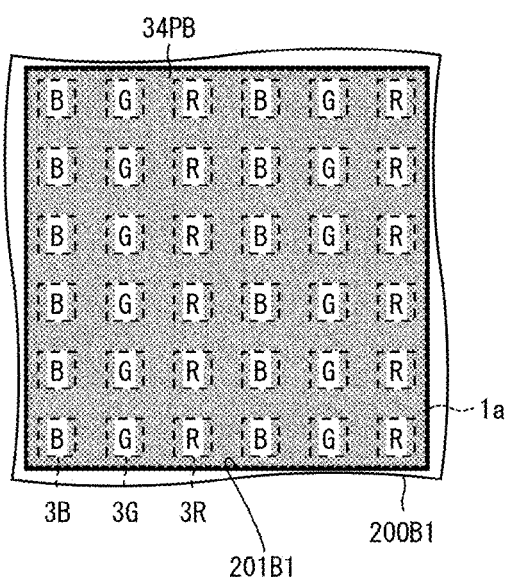

Next, to cover the red phosphorescent luminescent material containing layer 34PR, the green phosphorescent luminescent material containing layer 34PG, and the hole transport layer 32 not covered by the red phosphorescent luminescent material containing layer 34PR and the green phosphorescent luminescent material containing layer 34PG, the blue phosphorescent luminescent material containing layer 34PB is formed on the entire surface of the display region 1a in the TFT substrate 10 as illustrated in FIG. 6C (the blue phosphorescent luminescent material containing layer formation process).

Figure 6D:
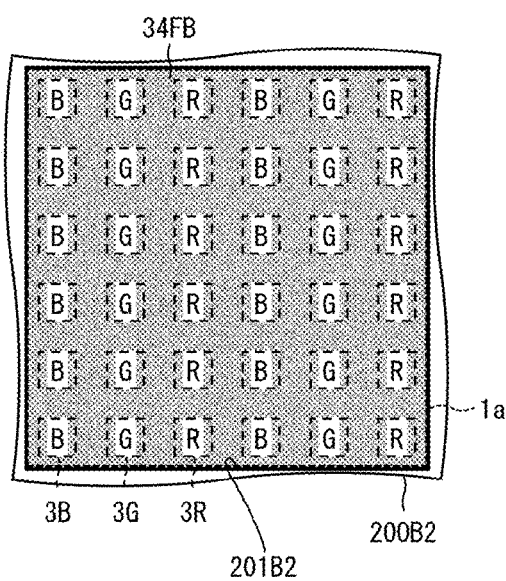

Then, to cover the blue phosphorescent luminescent material containing layer 34PB, the blue fluorescent luminescent material containing layer 34FB is formed on the entire surface of the display region 1a in the TFT substrate 10 as illustrated in FIG. 6D (the blue fluorescent luminescent material containing layer formation process).

As described earlier, the blue phosphorescent luminescent material containing layer 34PB and the blue fluorescent luminescent material containing layer 34FB are formed as a common light-emitting layer over the plurality of pixels 3. Therefore, as illustrated in FIG. 6C, an open mask having a mask opening 201B1 common to the plurality of pixels 3 is used for the vapor deposition mask 200B1 for the formation of the blue phosphorescent luminescent material containing layer. Similarly, as illustrated in FIG. 6D, an open mask having a mask opening 201B2 common to the plurality of pixels 3 is used for the vapor deposition mask 200B2 for the formation of the blue fluorescent luminescent material containing layer.

Note that the blue phosphorescent luminescent material containing layer 34PB and the blue fluorescent luminescent material containing layer 34FB have the same pattern in a plan view. Therefore, the blue phosphorescent luminescent material containing layer 34PB and the blue fluorescent luminescent material containing layer 34FB may be formed in continuation by using the same vapor deposition mask as the vapor deposition mask 200B1 and the vapor deposition mask 200B2, or may be formed by using exclusive vapor deposition masks for each layer.

Note that in FIGS. 6A to 6D, a case in which the vapor deposition masks 200R, 200G, 200B1, and 200B2 are vapor deposition masks for mask-fixed deposition is illustrated as an example. However, the present embodiment is not limited thereto, and the vapor deposition masks 200R, 200G, 200B1, and 200B2 may be vapor deposition masks for scan vapor deposition having a mask opening corresponding to some of the luminescent material containing layers 34 to be formed.

Further, in a case where the luminescent material containing layers 34 include a host material, the luminescent material containing layers 34 are formed by co-deposition of the host material and the luminescent material (the luminescent dopant material) constituting the luminescent material containing layers 34. The deposition ratio of each material can be adjusted by the deposition speed, for example.

Thereafter, for example, by using an open mask, as illustrated in FIG. 5, the electron transport layer 35 and the electron injection layer 36 are formed in this order on the entire surface of the display region 1a to cover the blue fluorescent luminescent material containing layer 34FB (the electron transport layer formation process and the electron injection layer formation process). However, as described earlier, the electron transport layer 35 and the electron injection layer 36 are not essential, and may be formed in an island shape for each pixel 3.

Next, the cathode electrode 23 is formed on the entire surface of the display region 1a in the TFT substrate 10 to cover the electron injection layer 36. A deposition technique such as a vacuum vapor deposition technique, a CVD, and a plasma CVD may be employed to form the cathode electrode 23, and a sputtering method, a printing method, or the like may be employed.

Next, the organic EL element 20 is sealed with the sealing film 40. The inorganic layer (the inorganic sealing layer) can be formed, for example, by CVD. The organic layer (the organic sealing layer) can be formed by applying an ink material, for example by an ink-jet method or the like, in a region surrounded by banks (protruding portions) (not illustrated), and the region being subjected to UV curing, for example.

After that, as necessary, a functional film such as a polarizing film and a touch sensor film, or a cover body such as a polarizing plate and a touch panel are pasted together.
Light-Emission Method of Organic EL Display Device 1

The organic EL display device 1 selectively emits the organic EL element 20 in each of the pixels 3 at the desired brightness using the TFT 12, thereby performing a color display. Hereafter, the light-emission method (the display method) of the organic EL display device 1 will be described with reference to FIG. 1 to FIGS. 3A and 3B, and FIG. 5.

Figure 1:
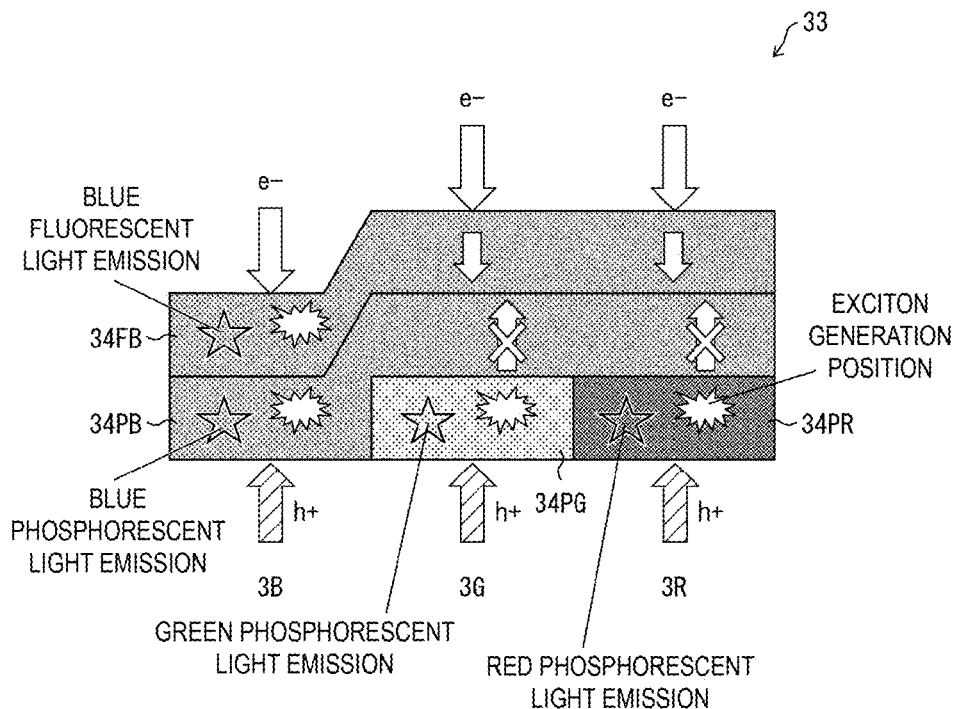
FIG. 1 is a schematic diagram illustrating a schematic configuration of a light-emitting layer unit of an organic EL display device according to a first embodiment of the disclosure together with a light-emission principle.
Figure 3A:
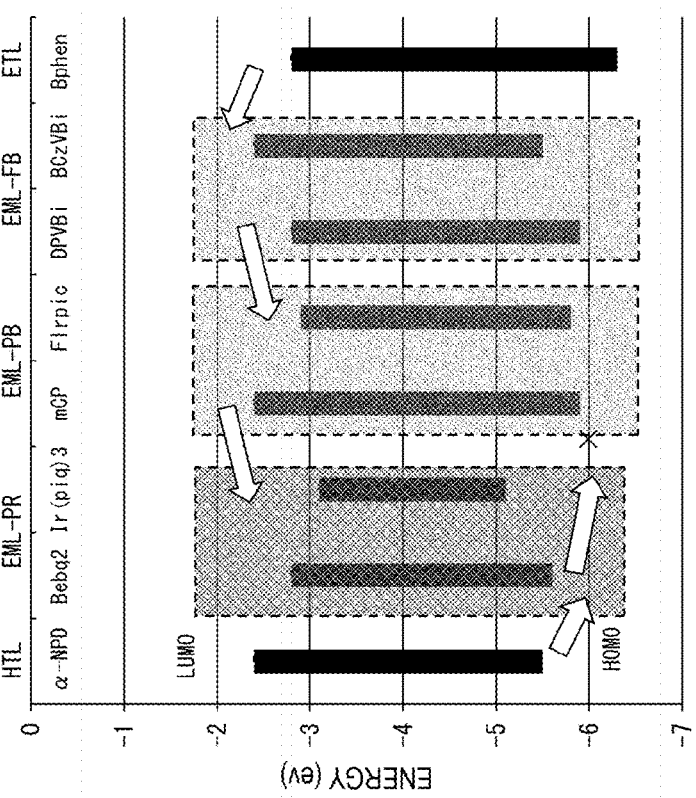
FIG. 3A is a diagram illustrating a light-emitting layer unit and an energy band of each layer adjacent to the light-emitting layer unit in a green pixel of the organic EL display device according to the first embodiment of the disclosure.
Figure 3B:
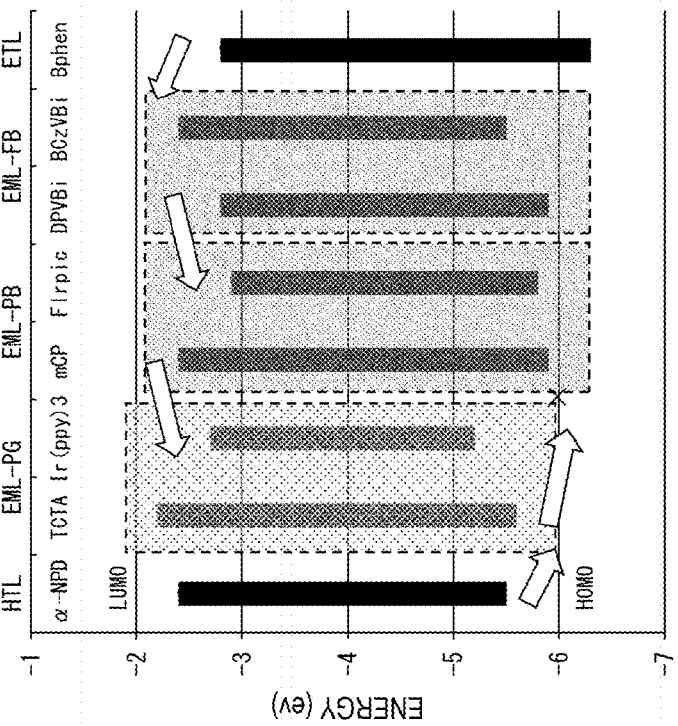
FIG. 3B is a diagram illustrating a light-emitting layer unit and an energy band of each layer adjacent to the light-emitting layer unit in a red pixel of the organic EL display device according to the first embodiment of the disclosure.

FIG. 1 is a schematic diagram illustrating a schematic configuration of the light-emitting layer unit 33 of the organic EL display device 1 according to the present embodiment, together with a light-emission principle. FIG. 2 is a diagram explaining a light emission mechanism in the blue pixel 3B of the organic EL display device 1 according to the present embodiment. FIG. 3A is a diagram illustrating the light-emitting layer unit 33 and the energy band of each layer adjacent to the light-emitting layer unit 33 in the green pixel 3G of the organic EL display device 1 according to the present embodiment, and FIG. 3B is a diagram illustrating the light-emitting layer unit 33 and the energy band of each layer adjacent to the light-emitting layer unit 33 in the red pixel 3R of the organic EL display device 1 according to the present embodiment. It is noted that in FIG. 1, illustrations other than the light-emitting layer unit 33 are omitted.

As illustrated in FIG. 1, in the organic EL display device 1 according to the present embodiment, the holes (h+) injected from the anode electrode 21 to the organic EL layer 22, and the electrons (e-) injected from the cathode electrode 23 to the organic EL layer 22 are recombined in the blue pixel 3B in the blue phosphorescent luminescent material containing layer 34PB and the blue fluorescent luminescent material containing layer 34FB to generate excitons respectively.

In the present embodiment, the blue phosphorescent luminescent material containing layer 34PB and the blue fluorescent luminescent material containing layer 34FB are layered in this order from the anode electrode 21 side. Therefore, out of the blue phosphorescent luminescent material containing layer 34PB and the blue fluorescent luminescent material containing layer 34FB, the blue phosphorescent luminescent material containing layer 34PB located at the anode electrode 21 side desirably includes a hole transport material, or a bipolar transport material including a hole transport material and an electron transporting material, and the blue fluorescent luminescent material containing layer 34FB located at the cathode electrode 23 side desirably includes an electron transporting material. More specifically, the host material in the blue phosphorescent luminescent material containing layer 34PB is desirably a hole transport material or a bipolar transport material, and the host material in the blue fluorescent luminescent material containing layer 34FB is desirably an electron transporting material. In this case, the holes and the electrons are easily bound in the blue phosphorescent luminescent material containing layer 34PB and the blue fluorescent luminescent material containing layer 34FB, and excitons are easily generated in the each of the layers.

Further, as illustrated in FIGS. 3A and 3B, out of the blue phosphorescent luminescent material containing layer 34PB (EML-FB) and the blue fluorescent luminescent material containing layer 34FB (EML-PB), in a case where the blue fluorescent luminescent material containing layer 34FB located at the cathode electrode 23 side includes a material having an HOMO level shallower than the blue phosphorescent luminescent material containing layer 34PB located at the anode electrode 21 side, holes easily enter the blue fluorescent luminescent material containing layer 34FB located at the cathode electrode 23 side.

Further, as illustrated in FIGS. 3A and 3B, out of the blue phosphorescent luminescent material containing layer 34PB and the blue fluorescent luminescent material containing layer 34FB, in a case where the blue fluorescent luminescent material containing layer 34FB located at the cathode electrode 23 side includes a material having a LUMO level shallower than the blue phosphorescent luminescent material containing layer 34PB located at the anode electrode 21 side, electrons easily enter the blue phosphorescent luminescent material containing layer 34PB located at the anode electrode 21 side.

In the example illustrated in FIGS. 3A and 3B, the blue fluorescent luminescent material containing layer 34FB includes a blue fluorescent luminescent material (BCzVBi) with an HOMO level and a LUMO level shallower than that of the blue phosphorescent luminescent material (Filpic) of the blue phosphorescent luminescent material containing layer 34PB.

For this reason, excitons are easily generated in each of the blue phosphorescent luminescent material containing layer 34PB and the blue fluorescent luminescent material containing layer 34FB, in the blue pixel 3B.

The values of the HOMO level and the LUMO level of the materials of each layer illustrated in FIG. 3A used in the present embodiment are shown in Table 1. Further, the values of the HOMO level and the LUMO level of the materials of each layer illustrated in FIG. 3B used in the present embodiment are shown in Table 2.

TABLE 1

|  |  | HOMO Level (eV) | LUMO level (eV) |
|---|---|---|---|
| HTL | α-NPD | −5.5 | −2.4 |
| EML- | Host material: TCTA | −5.6 | −2.4 |

TABLE 1-continued

|  |  | HOMO Level (eV) | LUMO level (eV) |
|---|---|---|---|
| PG | Luminescent dopant material: Ir(ppy)3 | −5.2 | −2.7 |
| EML-PB | Host material: mCP | −5.9 | −2.4 |
|  | Luminescent dopant material: Filpic | −5.8 | −2.9 |
| EML-FB | Host material: DPVBi | −5.9 | 2.8 |
|  | Luminescent dopant material: BCzVBi | −5.5 | −2.4 |
| ETL | Bphen | −6.3 | 2.8 |

TABLE 2

|  |  | HOMO Level (eV) | LUMO level (eV) |
|---|---|---|---|
| HTL | α-NPD | −5.5 | −2.4 |
| EML-PR | Host material: Bebq2 | −5.6 | 2.8 |
|  | Luminescent dopant material: Ir(piq)3 | −5.1 | −3.1 |
| EML-PB | Host material: mCP | −5.9 | −2.4 |
|  | Luminescent dopant material: Filpic | −5.8 | −2.9 |
| EML-FB | Host material: DPVBi | −5.9 | 2.8 |
|  | Luminescent dopant material: BCzVBi | −5.5 | −2.4 |
| ETL | Bphen | −6.3 | 2.8 |

As illustrated in FIG. 2, each of the excitons generated in each of the blue phosphorescent luminescent material containing layer 34PB and the blue fluorescent luminescent material containing layer 34FB emits light when returning to the ground state ($S_0$ state) upon deactivation.

Therefore, in the blue pixel 3B, blue light including blue phosphorescent light produced when the excitons (the triplet excitons) in the triplet excited state ($T_1$ state) generated in the blue phosphorescent luminescent material containing layer 34PB return to the $S_0$ state, and blue fluorescent light produced when the excitons (the singlet excitons) in the singlet excited state (Sistate) generated in the blue fluorescent luminescent material containing layer 34FB return to the $S_0$ state is output.

On the other hand, in the green pixel 3G, as illustrated in FIG. 3A, out of the blue phosphorescent luminescent material containing layer 34PB and the blue fluorescent luminescent material containing layer 34FB, since the material included in the blue phosphorescent luminescent material containing layer 34PB located at the anode electrode 21 side (in other words, the green phosphorescent luminescent material containing layer 34PG side) has an HOMO level deeper than the green phosphorescent luminescent material (Ir(PPy)3 in the example illustrated in FIG. 3A), the blue phosphorescent luminescent material containing layer 34PB functions as a hole blocking layer for the green phosphorescent luminescent material containing layer 34PG.

Further, in the green pixel 3G, out of the blue phosphorescent luminescent material containing layer 34PB and the blue fluorescent luminescent material containing layer 34FB, since the triplet excitation level of the blue phosphorescent luminescent material included in the blue phosphorescent luminescent material containing layer 34PB located at the anode electrode 21 side (the green phosphorescent luminescent material containing layer 34PG side) is higher than the triplet excitation level of the green phosphorescent luminescent material, energy transfer from the green phosphorescent luminescent material to the blue phosphorescent luminescent material containing layer 34PB and the blue fluorescent luminescent material containing layer 34FB is difficult.

Therefore, as illustrated in FIG. 1, the holes injected from the anode electrode 21 to the organic EL layer 22, and the electrons injected from the cathode electrode 23 to the organic EL layer 22 are recombined only in the green phosphorescent luminescent material containing layer 34PG in the green pixel 3G to generate excitons. As a result, in the green pixel 3G, green phosphorescent light produced when an exciton (a triplet exciton) in the $T_1$ state generated in the green phosphorescent luminescent material containing layer 34PG returns to the $S_0$ state is output.

Similarly, in the red pixel 3R, as illustrated in FIG. 3B, out of the blue phosphorescent luminescent material containing layer 34PB and the blue fluorescent luminescent material containing layer 34FB, since the material included in the blue phosphorescent luminescent material containing layer 34PB located at the anode electrode 21 side (in other words, the red phosphorescent luminescent material containing layer 34PR side) has an HOMO level deeper than the red phosphorescent luminescent material (Ir(pip)3 in the example illustrated in FIG. 3B), the blue phosphorescent luminescent material containing layer 34PB functions as a hole blocking layer for the red phosphorescent luminescent material containing layer 34PR.

Further, in the red pixel 3R, out of the blue phosphorescent luminescent material containing layer 34PB and the blue fluorescent luminescent material containing layer 34FB, since the triplet excitation level of the blue phosphorescent luminescent material included in the blue phosphorescent luminescent material containing layer 34PB located at the anode electrode 21 side (the red phosphorescent luminescent material containing layer 34PR side) is higher than the triplet excitation level of the red phosphorescent luminescent material, energy transfer from the red phosphorescent luminescent material to the blue phosphorescent luminescent material containing layer 34PB and the blue fluorescent luminescent material containing layer 34FB is difficult.

Therefore, as illustrated in FIG. 1, the holes injected from the anode electrode 21 to the organic EL layer 22, and the electrons injected from the cathode electrode 23 to the organic EL layer 22 are recombined only in the red phosphorescent luminescent material containing layer 34PR in the red pixel 3R to generate excitons. As a result, in the red pixel 3R, red phosphorescent light produced when an exciton (a triplet exciton) in the T state generated in the red phosphorescent luminescent material containing layer 34PR returns to the $S_0$ state is output.

Thus, in the green pixel 3G and the red pixel 3R, excitons are not generated in the blue phosphorescent luminescent material containing layer 34PB and the blue fluorescent luminescent material containing layer 34FB, and the blue phosphorescent luminescent material and the blue fluorescent luminescent material do not emit light. As a result, in the green pixel 3G, only the green phosphorescent luminescent material emits light, and in the red pixel 3R, only the red phosphorescent luminescent material emits light.

Advantageous Effects

Figure 4:
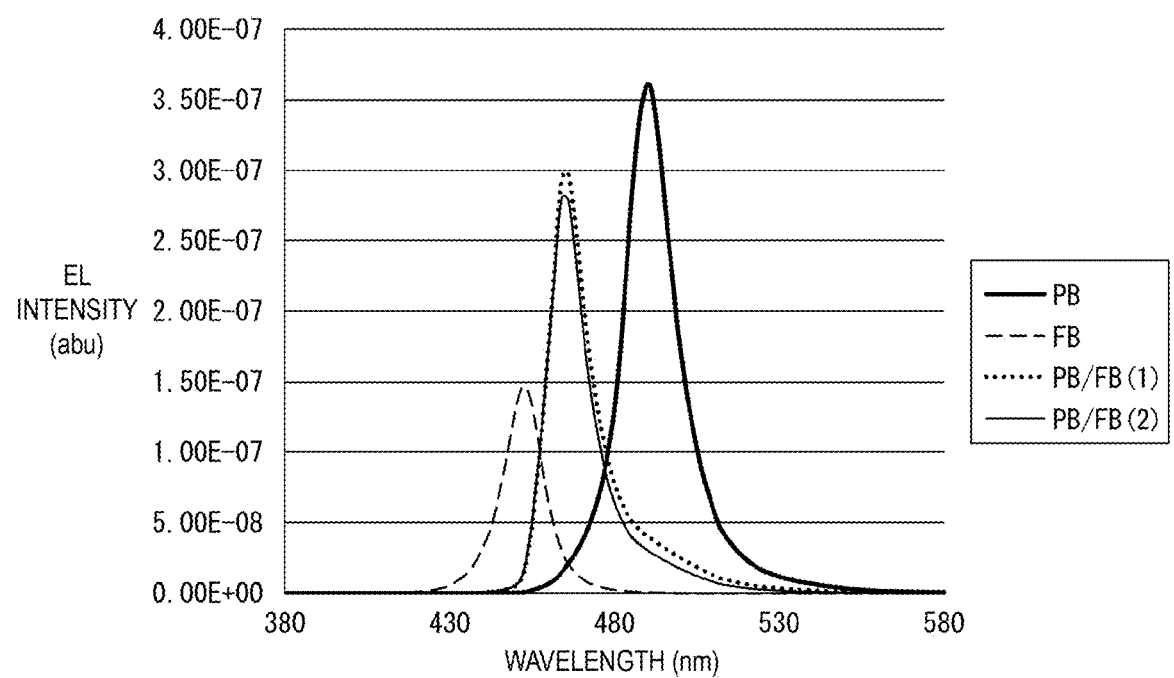
FIG. 4 is a graph showing an example of a PL emission spectrum of a blue fluorescent luminescent material and a blue phosphorescent luminescent material in a blue organic EL element according to the first embodiment of the disclosure.

FIG. 4 is a graph showing an example of a photoluminescence (PL) light emission spectrum of the blue fluorescent luminescent material and the blue phosphorescent luminescent material in the blue organic EL element 20B according to the present embodiment.

In FIG. 4, all of the PB, FB, PB/FB (1), and PB/FB (2) use a top-emission type blue organic EL element 20B, and an example of a PL emission spectrum of blue light extracted by using resonance through simulation is illustrated.

In this case, only a blue phosphorescent luminescent material is used as the luminescent material in the PB, and only a blue fluorescent luminescent material is used as the luminescent material in the FB. That is, only the blue phosphorescent luminescent material containing layer 34PB is formed as the light-emitting layer in the PB, and only the blue fluorescent luminescent material containing layer 34FB is formed as the light-emitting layer in the FB. Further, in the PB/FB (1) and the PB/FB (2), a blue phosphorescent luminescent material and a blue fluorescent luminescent material are used as the luminescent material, respectively. Note that in FIG. 4, FIrpic is used as the blue phosphorescent luminescent material, while BCzVBi is used as the blue fluorescent luminescent material.

Furthermore, the thickness of the light-emitting layer in each of the PB, FB, PB/FB (1), and PB/FB (2) is 30 nm, and in the PB/FB (1), the thickness of the blue phosphorescent luminescent material containing layer 34PB is 20 nm and the thickness of the blue fluorescent luminescent material containing layer 34FB is 10 nm. In the PB/FB (2), the thickness of the blue phosphorescent luminescent material containing layer 34PB is set to 5 nm, and the thickness of the blue fluorescent luminescent material containing layer 34FB is set to 25 nm.

Further, to adjust the distance between the reflective layer and the transreflective layer to an optical path length at which the peak wavelength of the light output from the blue organic EL element 20B resonates, the thickness of the hole injection layer 31 is set to 150 nm in the PB, 90 nm in the FB, and 120 nm in the PB/FB (1) and the PB/FB (2), respectively. Conditions other than the above are the same in each of the PB, the FB, the PB/FB (1), and the PB/FB (2). Note that ITO is used as the light-transmissive electrode 21b in the anode electrode 21. The thickness of the ITO is set to 19 nm.

Further, the results of simulation of color purity and power consumption in a case where the light-emitting layer unit 33 includes the blue phosphorescent luminescent material containing layer 34PB and the blue fluorescent luminescent material containing layer 34FB as the common layer as illustrated in FIG. 1, and for comparison, in a case where the light-emitting layer unit 33 includes only the blue fluorescent luminescent material containing layer 34FB as the common layer are shown in Table 3 along with the measurement conditions.

Note that in the simulation, in a case where the thickness of the layer between the reflective electrode 21a and the center portion of the blue phosphorescent luminescent material containing layer 34PB in the film thickness direction was "d", the layer including the light-transmissive electrode 21b, the refractive index of the layer between the reflective electrode 21a and the center portion of the blue phosphorescent luminescent material containing layer 34PB in the film thickness direction was "n", and the center wavelength of light in the blue wavelength region output from the blue phosphorescent luminescent material containing layer 34PB was λ, then the condition was set so that nd=3/42. At this time, ITO having a thickness of 19 nm was used for the light-transmissive electrode 21b. Further, the thickness of the blue phosphorescent luminescent material containing layer 34PB was 20 nm, and the thickness of the blue fluorescent luminescent material containing layer 34FB was 10 nm. Further, the film thickness of the layer between the reflective electrode 21a and the center portion of the blue phosphorescent luminescent material containing layer 34PB in the film thickness direction was 130 nm.

rescence emitted from the blue fluorescent luminescent material containing layer 34FB.

TABLE 3

|  |  | Fluorescence only | | | Fluorescence + phosphorescence | | |
| --- | --- | --- | --- | --- | --- | --- | --- |
| Panel size | Diagonal | 5.50 inch | | | 5.50 inch | | |
|  | Vertical × horizontal | 121.9 × 68.5 mm | | | 121.9 × 68.5 mm | | |
| Resolution (dot) | | WQHD (2560 × 1440) | | | WQHD (2560 × 1440) | | |
| Pixel size: Vertical × horizontal | | 47.6 × 15.9 μm | | | 47.6 × 15.9 μm | | |
| Pixel area | | $7.553 \times 10^{-6}$ cm$^2$ | | | $7.553 \times 10^{-6}$ cm$^2$ | | |
| Resolution | | 534 ppi | | | 534 ppi | | |
|  |  | R | G | B | R | G | B |
| Front panel brightness | | | 500 cd/m$^2$ | | | 500 cd/m$^2$ | |
| Optical aperture ratio of each pixel | | 5.0% | 5.0% | 5.0% | 5.0% | 5.0% | 5.0% |
| White color setting | x | | 0.3127 | | | 0.3127 | |
|  | y | | 0.3290 | | | 0.3290 | |
| Color purity of each color | x | 0.674 | 0.223 | 0.153 | 0.674 | 0.223 | 0.126 |
|  | y | 0.325 | 0.728 | 0.022 | 0.325 | 0.728 | 0.078 |
| Instantaneous required brightness of each color | Luminance ratio | 26.0% | 71.2% | 2.8 | 28.8% | 60.9% | 10.3% |
|  | Luminance of each color (cd/m$^2$) | 130.0 | 356.2 | 13.9 | 144.1 | 304.6 | 51.3 |
| Polarizing plate transmittance | | | 42.0% | | | 42.0% | |
| In-pixel instantaneous required brightness of each color | | 6188.5 | 16960.9 | 660.2 | 6862.1 | 14505.3 | 2442.1 |
| OLED efficiency: Required brightness | | 36.0 | 78.7 | 3.1 | 35.9 | 80.1 | 20.0 |
| OLED voltage: Required brightness | | 3.74 | 3.78 | 3.47 | 3.80 | 3.69 | 4.05 |
| Current in each color: 100% lighting | | 71.7 mA | 90.0 mA | 90.1 mA | 80 mA | 76 mA | 51 mA |
| Current in one pixel: 100% lighting | | 0.019 μA | 0.024 μA | 0.024 μA | 0.022 μA | 0.021 μA | 0.014 μA |
| Power consumption of each color | 100% lighting | 0.268 W | 0.340 W | 0.312 W | 0.303 W | 0.280 W | 0.207 W |
|  | Ratio (%) | 29.1 | 37.0 | 33.9 | 38.4 | 35.4 | 26.2 |
| Power consumption: 100% lighting | | | 0.921 | | | 0.789 | |

As described earlier, while the internal quantum efficiency of the blue phosphorescent luminescent material is theoretically 100%, the blue fluorescent luminescent material has a low internal quantum efficiency of 25%. Therefore, as illustrated in FIG. 4, the peak intensity of light emission for blue fluorescence is extremely lower than that of blue phosphorescence. On the other hand, as illustrated in FIG. 4, the blue fluorescence has a shorter wavelength and a deeper blue level than the blue phosphorescence. The shorter the wavelength, the brightness can be reduced when keeping white balance.

Thus, in the present embodiment, as described above, while the blue color level is shallow in the blue pixel 3B, a high-efficiency blue phosphorescent luminescent material with the high-efficiency internal quantum efficiency being theoretically 100%, and a fluorescent luminescent material with a poorer internal quantum efficiency than that of the blue phosphorescent luminescent material and a deep blue color level are layered to emit light respectively.

In the present embodiment, as described above, excitons respectively are generated in the blue phosphorescent luminescent material containing layer 34PB and the blue fluorescent luminescent material containing layer 34FB to output, from the blue pixel 3B, mixed light of the phosphorescence emitted from the blue phosphorescent luminescent material containing layer 34PB, and the fluo- Thus, as indicated by the PL emission spectrum shown in FIG. 4, as in the color purity of blue (B) among the color purities of each color indicated by the xy color level coordinates in the Commission Internationale de l'Eclairage (CIE): International Commission on Illumination) color level diagram shown in Table 3, although the blue color level is inferior (that is, becomes shallow) in comparison with a case in which the blue pixel 3B outputs only blue fluorescent light, the blue color level is good (that is, becomes deep) in comparison with a case in which the blue pixel 3B outputs only blue phosphorescent light, and thus as shown in Table 3, it is possible to provide the organic EL display device 1 by which the power consumption can be reduced in comparison with a case in which the blue pixel 3B outputs only the blue fluorescent light.

Thus, according to the present embodiment, it is possible to provide the organic EL display device 1 capable of emitting light having a plurality of colors including blue light with a good balance between luminous efficiency and color level and with a power consumption less than that in the related art, in the blue pixel 3B.

Further, according to the present embodiment, as described above, a balance between luminous efficiency and color level is kept to achieve a device design conforming to the product characteristics such as focus on power consumption and focus on color gamut is possible.

Further, according to the present embodiment, as described above, since an improved efficiency can be achieved in comparison with a case in which only a blue fluorescent luminescent material is used as the blue luminescent material, even if the blue phosphorescent luminescent material containing layer 34PB and the blue fluorescent luminescent material containing layer 34FB are provided in common for each pixel 3 as described above during high resolution separate-patterning of RGB, an increase in power consumption due to such common usage can be suppressed. Therefore, according to the present embodiment, as described above, the blue phosphorescent luminescent material containing layer 34PB and the blue fluorescent luminescent material containing layer 34FB can be provided in common for each pixel 3, making it easy to comply with the high resolution of the display device.

Further, in particular, since the blue pixel 3B has a poor internal quantum efficiency in which the probability of generation of excitons in the $S_1$ state in the blue fluorescent luminescent material containing layer 34FB is 25%, the opening needs to be made as large as possible. However, the larger the opening is made, the smaller the vapor deposition margin becomes, and thus there occurs a problem in accuracy in separately patterning. However, according to the present embodiment, as described above, the blue phosphorescent luminescent material containing layer 34PB and the blue fluorescent luminescent material containing layer 34FB are provided in common to the plurality of pixels 3 to increase the aperture ratio of the blue pixel 3B to achieve a long lifespan. Further, according to the present embodiment, as described above, the blue phosphorescent luminescent material containing layer 34PB and the blue fluorescent luminescent material containing layer 34FB are provided in common to the plurality of pixels 3 to eliminate the need for a high-resolution vapor deposition mask for the formation of the blue phosphorescent luminescent material containing layer 34PB and the blue fluorescent luminescent material containing layer 34FB. It is technically difficult to separately pattern RGB by using a very high-resolution vapor deposition mask. According to the present embodiment, separately patterning may be performed only for the green phosphorescent luminescent material containing layer 34PG in the green pixel 3G, and the red phosphorescent luminescent material containing layer 34PR in the red pixel 3R. Thus, the number of times of separately patternings can be suppressed to twice. This simplifies the manufacture of the organic EL display device 1.

First Modified Example

In the present embodiment, as illustrated in FIG. 1 to FIGS. 3A and 3B, and FIG. 5, a case in which the blue phosphorescent luminescent material containing layer 34PB and the blue fluorescent luminescent material containing layer 34FB are layered in this order from the anode electrode 21 side is described as an example. However, the present embodiment is not limited thereto, and the layers may be provided in the order of the blue fluorescent luminescent material containing layer 34FB and the blue phosphorescent luminescent material containing layer 34PB, from the anode electrode 21 side.

However, as described above, the material included in the blue phosphorescent luminescent material containing layer 34PB has a deeper HOMO level than the green phosphorescent luminescent material and the red phosphorescent luminescent material, and the blue phosphorescent luminescent material containing layer 34PB functions as a hole blocking layer for the green phosphorescent luminescent material containing layer 34PG and the red phosphorescent luminescent material containing layer 34PR.

Further, a hole transport material or a bipolar transport material is used for the host material of the blue phosphorescent luminescent material containing layer 34PB. Therefore, the blue phosphorescent luminescent material containing layer 34PB has a high hole transport property.

On the other hand, the blue fluorescent luminescent material containing layer 34FB has the electron mobility higher than the hole mobility, and has an electron transport property. Therefore, the blue fluorescent luminescent material containing layer 34FB also functions as an electron transport layer, and electrons flow easily.

In addition, as shown in Table 1, Table 2, and FIGS. 3A and 3B, the host material and the luminescent material (luminescent dopant material) included in the blue phosphorescent luminescent material containing layer 34PB has a larger gap (band gap) between the HOMO level and the LUMO level than the host material and light-emitting material (luminescent dopant material) included in the blue fluorescent luminescent material containing layer 34FB. As a result, while electrons can be efficiently transferred from the blue fluorescent luminescent material containing layer 34FB to the blue phosphorescent luminescent material containing layer 34PB, holes can be efficiently transferred from the blue phosphorescent luminescent material containing layer 34PB to the blue fluorescent luminescent material containing layer 34FB, in the blue pixel 3B.

Thus, it is more desirable for the blue phosphorescent luminescent material containing layer 34PB and the blue fluorescent luminescent material containing layer 34FB to be layered in this order from the anode electrode 21 side.

Second Modified Example

Further, in the present embodiment, a case in which the green pixel 3G and the red pixel 3R are provided as the second pixel is described as an example, but the present embodiment is not limited thereto. Any color may be provided as the second pixel as long as the color has a peak wavelength longer than the peak wavelength of blue light such as yellow (Y) and magenta (M). Further, the picture element 2 may not include the pixels 3 in three colors, and may include pixels 3 in two or four colors.

Second Embodiment

A description will be given of another embodiment of the disclosure, mainly with reference to FIG. 7.

The present embodiment will be described about differences between the present embodiment and the first embodiment, and components having the same functions as those of the components described in the first embodiment are appended with the same reference signs, and the description thereof is omitted.

Schematic Configuration of Organic EL Display Device 1

The organic EL display device 1 according to the present embodiment is same as the organic EL display device 1 according to the first embodiment except for the points that the blue fluorescent luminescent material in the blue fluorescent luminescent material containing layer 34FB includes a blue delayed fluorescent luminescent material (blue Triplet-Triplet Annihilation (TTA) material) that generates a singlet exciton from a triplet exciton through a TTA phenomenon, while the thickness of the blue fluorescent luminescent material containing layer 34FB is within a range in which energy transfer (Dexter transfer) occurs by the Dexter mechanism (electron exchange interaction).

The blue delayed fluorescent luminescent material emits light through re-excitation from the $T_1$ level to the $S_1$ level either in cooperation with the host material by producing the TTA phenomenon by the collision and fusion of triplet excitons, or individually.

Examples of the blue delayed fluorescent luminescent material include aromatic dimethylidene compounds such as 4,4'-bis(2,2'-diphenylvinyl)-biphenyl (DPVBi), distyrylamine derivatives such as distyryldiamine compounds, pyrene derivatives, fluoranthene derivatives, perylene and perylene derivatives, anthracene derivatives, benzoxazole derivatives, benzothiazole derivatives, benzimidazole derivatives, chrysene derivatives, phenanthrene derivatives, and distyrylbenzene derivatives.

Note that in a case where the blue fluorescent luminescent material thus includes a blue delayed luminescent material, the $T_1$ level of the blue phosphorescent luminescent material in the blue phosphorescent luminescent material containing layer 34PB is desirably higher than the $T_1$ level of the blue delayed fluorescent luminescent material.

A Dexter transfer occurs only between adjacent molecules. Therefore, in a case where the thickness of the blue fluorescent luminescent material containing layer 34FB is large, the luminous efficiency may decline. Therefore, in a case where a Dexter transfer is thus used, the thickness of the blue fluorescent luminescent material containing layer 34FB is desirably 5 mn or less. Further, to efficiently generate the TTA in the blue fluorescent luminescent material containing layer 34FB, the thickness of the blue fluorescent luminescent material containing layer 34FB is desirably 2 nm or less, and more desirably 1 nm or less.

Light-Emission Method of Organic EL Display Device 1

Figure 7:
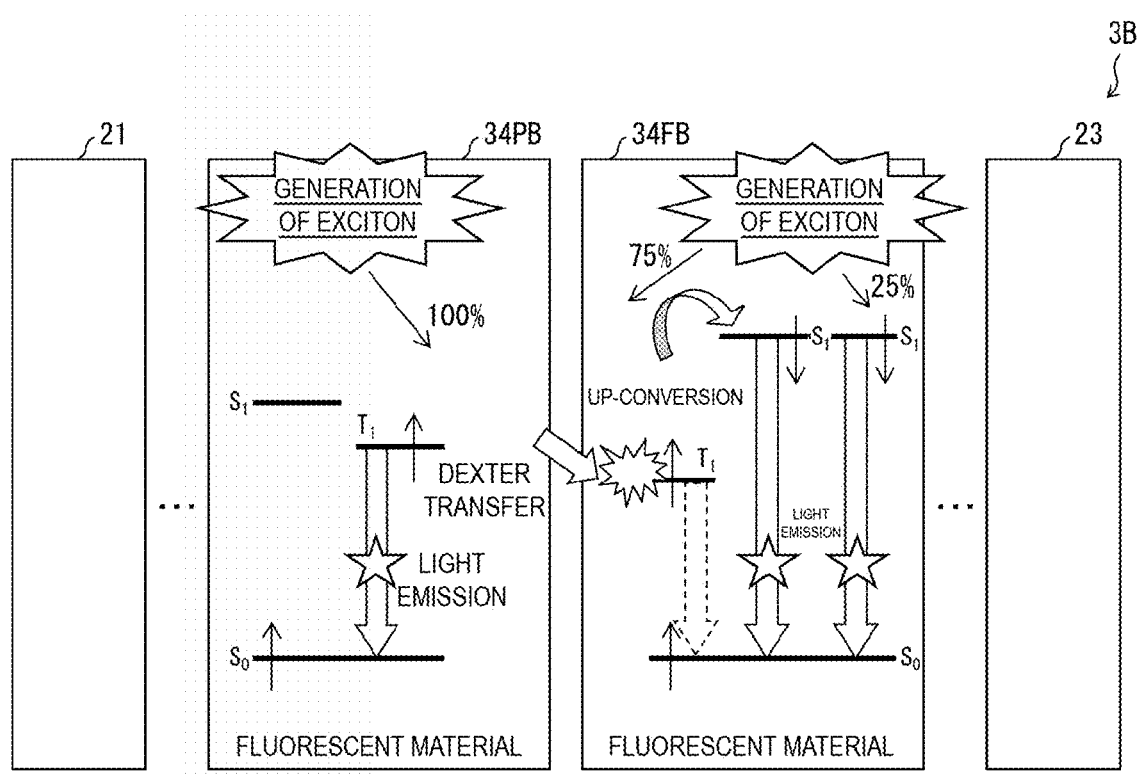
FIG. 7 is a diagram explaining a light emission mechanism in a blue pixel of an organic EL display device according to a second embodiment of the disclosure.

FIG. 7 is a diagram explaining a light emission mechanism in the blue pixel 3B of the organic EL display device 1 according to the present embodiment.

As illustrated in FIG. 7, even in the present embodiment, the holes (h+) injected from the anode electrode 21 to the organic EL layer 22, and the electrons (e-) injected from the cathode electrode 23 to the organic EL layer 22 are recombined in the blue pixel 3B in the blue phosphorescent luminescent material containing layer 34PB and the blue fluorescent luminescent material containing layer 34FB to generate excitons respectively.

Note that even in the present embodiment, in the blue fluorescent luminescent material containing layer 34FB, the probability of generation of excitons in the singlet excited state (the Sistate) is 25%, and the probability of generation of excitons in the triplet excited state (the $T_1$ state) is 75%. Further, the probability of generation of excitons in the triplet excited state (the $T_1$ state) in the blue phosphorescent luminescent material containing layer 34PB is theoretically 100%.

Some of the triplet excitons generated in the blue phosphorescent luminescent material containing layer 34PB emit light in a blue wavelength region (second wavelength region) when returning to the ground state ($S_0$). The remaining part of the remaining triplet excitons generated in the blue phosphorescent luminescent material containing layer 34PB perform Dexter transfer (Triplet-Triplet Energy Transfer: TTET) to the energy level ($T_1$ level) in the lowest triplet excited state of the blue fluorescent luminescent material containing layer 34FB.

Then, the excitons that have thus undergone Dexter transfer from the $T_1$ level of the blue phosphorescent luminescent material containing layer 34PB to the $T_1$ level of the blue fluorescent luminescent material containing layer 34FB are up-converted to the $S_1$ level of the blue fluorescent luminescent material containing layer 34FB having an energy level higher than the $S_1$ level of the blue phosphorescent luminescent material containing layer 34PB and the $T_1$ level of the blue fluorescent luminescent material containing layer 34FB, through the TTA.

As a result, the light output from the blue pixel 3B includes the (i) blue phosphorescent light produced when the triplet excitons generated in the blue phosphorescent luminescent material containing layer 34PB return to the ground state ($S_0$), the (ii) blue fluorescent light produced when the singlet excitons generated in the blue fluorescent luminescent material containing layer 34FB return to the ground state ($S_0$), and the (iii) blue fluorescent light produced when some of the energy of the triplet excitons generated in the blue phosphorescent luminescent material containing layer 34PB is transferred to the triplet excitons generated in the blue fluorescent luminescent material containing layer 34FB by the Dexter mechanism, and the singlet excitons generated through up-conversion to singlet excitons from the triplet excitons generated in the blue fluorescent luminescent material containing layer 34FB return to the ground state through TTA.

Thus, since the light output from the blue pixel 3B further includes the fluorescent light emitted from the blue fluorescent luminescent material containing layer 34FB through energy transfer (Dexter transfer) of the triplet excitons from the blue phosphorescent luminescent material containing layer 34PB and up-conversion via TTA, the internal quantum efficiency of the blue fluorescent luminescent material containing layer 34FB can be theoretically increased up to 40%. Therefore, according to the present modified example, the light emission efficiency of the blue pixel 3B can be further improved.

Note that in a case where the blue fluorescent luminescent material containing layer 34FB includes a host material, the $T_1$ level of the host material may be smaller than the $T_1$ level of the blue fluorescent luminescent material. Thus, the triplet excitons are concentrated in the host material, and the density of the triplet excitons increases. As a result, the triplet excitons efficiently collide with each other, and the singlet excitons are efficiently generated.

Further, the $S_1$ level of the blue fluorescent luminescent material is preferably smaller than the $S_1$ level of the host material. Thus, the singlet excitons of the host material generated through the TTA transfer the energy to the blue fluorescent luminescent material, and the blue fluorescent luminescent material emits fluorescent light.

Third Embodiment

Figure 8:
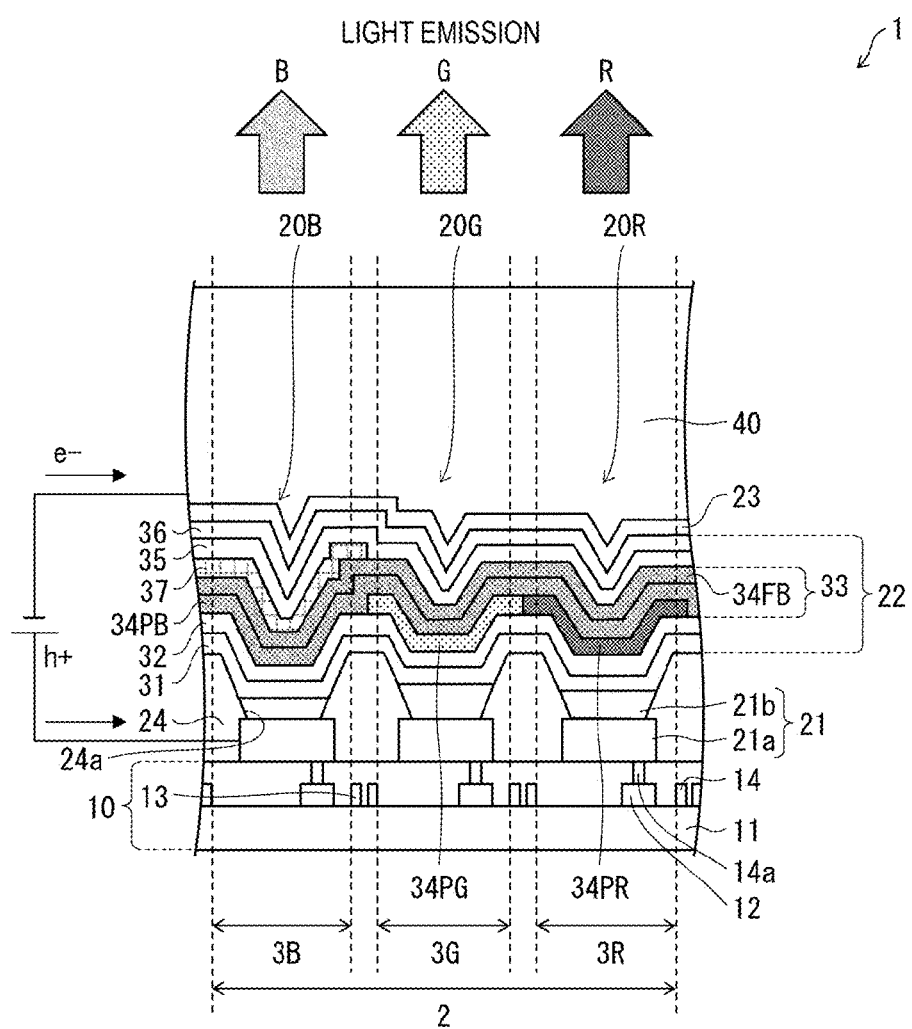
FIG. 8 is a cross-sectional view illustrating a schematic configuration of main portions of an organic EL display device according to a third embodiment of the disclosure.
Figure 9:
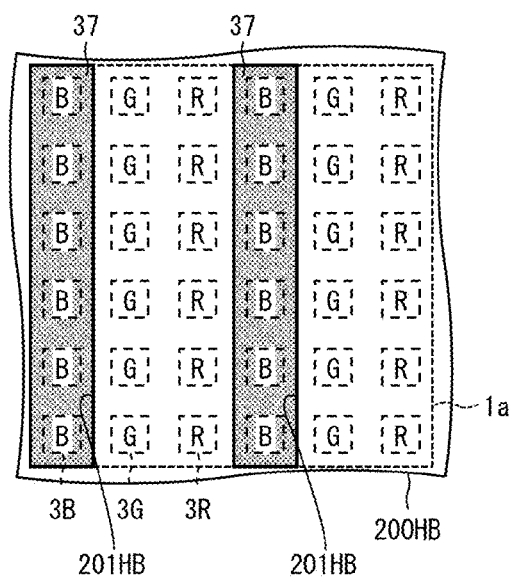
FIG. 9 is a plan view illustrating a hole blocking layer formation process in manufacturing the organic EL display device according to the third embodiment of the disclosure.

A description follows regarding yet another embodiment of the disclosure, mainly with reference to FIG. 8 and FIG. 9.

The present embodiment will be described about differences between the present embodiment and the first and second embodiments, and components having the same functions as those of the components described in the first and second embodiments are appended with the same reference signs, and the description thereof is omitted.

Schematic Configuration of Organic EL Display Device

FIG. 8 is a cross-sectional view illustrating a schematic configuration of main portions of the organic EL display device 1 according to the present embodiment.

As illustrated in FIG. 8, the organic EL display device 1 according to the present embodiment is same as the organic EL display device 1 according to the first and second embodiments except for the points that in the blue pixel 3B, a hole blocking layer 37 is present adjacent to the blue fluorescent luminescent material containing layer 34FB between the blue fluorescent luminescent material containing layer 34FB located at the cathode electrode 23 side and the cathode electrode 23, out of the blue phosphorescent luminescent material containing layer 34PB and the blue fluorescent luminescent material containing layer 34FB.

The organic EL layer 22 of the organic EL display device 1 according to the present embodiment has a configuration in which the hole injection layer 31, the hole transport layer 32, the light-emitting layer unit 33 including a plurality of luminescent material containing layers 34, the hole blocking layer 37, the electron transport layer 35, and the electron injection layer 36 are layered in this order from the anode electrode 21 side.

In the present embodiment, the hole blocking layer 37 is provided only in the blue pixel 3B. As described in the first embodiment, the blue phosphorescent luminescent material containing layer 34P functions as a hole blocking layer for the green phosphorescent luminescent material containing layer 34PG. Therefore, a hole blocking layer is unnecessary for the green pixel 3G and the red pixel 3R.

The hole blocking layer 37 may be formed of a material having an HOMO level deeper than that of a material (a host material and a luminescent material) included in a layer adjacent to the hole blocking layer 37 (the blue fluorescent luminescent material containing layer 34FB in the example illustrated in FIG. 8), out of the blue phosphorescent luminescent material containing layer 34PB and the blue fluorescent luminescent material containing layer 34FB, and the thickness of the hole blocking layer 37 is not particularly restricted.

An electron transporting material, for example, can be used for the material of the hole blocking layer 37. The above materials can be employed for the electron transporting material, for example.

Manufacturing Method of Organic EL Display Device 1

FIG. 9 is a plan view illustrating a hole blocking layer formation process in a manufacturing process of the organic EL display device 1 according to the present embodiment.

The manufacturing process of the organic EL display device 1 according to the present embodiment is same as the manufacturing process of the organic EL display device 1 according to the first embodiment except for the point that the organic EL element preparation process includes a hole blocking layer formation process for forming (laminating) the hole blocking layer 37 adjacent to the layer located at the cathode electrode 23 side, out of the blue fluorescent luminescent material containing layer 34FB and the blue phosphorescent luminescent material containing layer 34PB, in the blue pixel 3B.

When the organic EL display device 1 illustrated in FIG. 8 is manufactured as the organic EL display device 1 according to the present embodiment, the hole blocking layer formation process illustrated in FIG. 9 is performed in continuation to the blue fluorescent luminescent material containing layer formation process illustrated in FIG. 6D so that the blue fluorescent luminescent material containing layer 34FB and the hole blocking layer 37 are layered adjacently to each other.

In the hole blocking layer formation process illustrated in FIG. 9, a stripe-like island-shaped hole blocking layer 37 is formed on the blue fluorescent luminescent material containing layer 34FB through separately patterning vapor deposition using a vapor deposition mask 200HB provided with a mask opening 201HB corresponding to the blue pixel 3B.

Note that in FIG. 9, same as FIGS. 6A to 6D, a case in which the vapor deposition mask 200HB is a vapor deposition mask for mask-fixed deposition is illustrated as an example. However, the present embodiment is not limited thereto, and the vapor deposition mask 200HB may be a vapor deposition mask for scan vapor deposition having a mask opening corresponding to a part of the hole blocking layer 37 to be formed.

Thereafter, same as the first embodiment, the organic EL display device 1 illustrated in FIG. 8 can be manufactured by performing the electron transport layer formation process, the electron injection layer formation process, the cathode formation process, and the sealing step.

According to the present embodiment, as described above, the hole blocking layer 37 is provided adjacent to the blue fluorescent luminescent material containing layer 34FB between the blue fluorescent luminescent material containing layer 34FB located at the cathode electrode 23 side and the cathode electrode 23 in the blue pixel 3B to prevent a hole leakage from the blue fluorescent luminescent material containing layer 34F in the blue pixel 3B.

Therefore, according to the present embodiment, a decline in the luminous efficiency due to a hole leakage can be suppressed in each of the pixels 3.

Fourth Embodiment

A description will be given of yet another embodiment of the disclosure mainly with reference to FIG. 10.

The present embodiment will be described about differences between the present embodiment and the first to third embodiments, and components having the same functions as those of the components described in the first to third embodiments are appended with the same reference signs, and the description thereof is omitted.

Schematic Configuration of Organic EL Display Device

Figure 10:
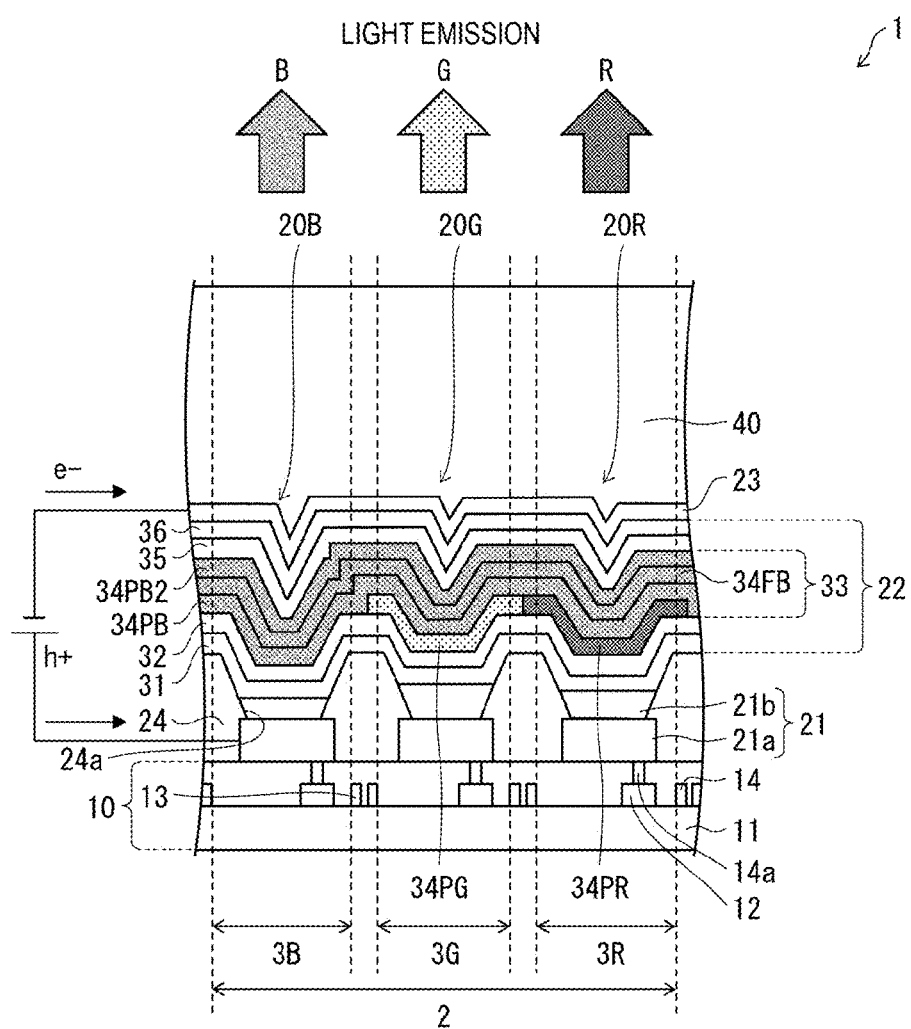
FIG. 10 is a cross-sectional view illustrating a schematic configuration of main portions of the organic EL display device according to a fourth embodiment of the disclosure.

FIG. 10 is a cross-sectional view illustrating a schematic configuration of main portions of the organic EL display device 1 according to the present embodiment.

The organic EL display device 1 according to the present embodiment has the same configuration as the organic EL display device 1 according to the first embodiment except for the point that the light-emitting layer unit 33 has a blue phosphorescent luminescent material containing layer 34PB2 (a third phosphorescent luminescent material containing layer) adjacent to the blue fluorescent luminescent material containing layer 34FB, between the blue fluorescent luminescent material containing layer 34FB and the cathode electrode 23.

The blue phosphorescent luminescent material containing layer 34PB2 is formed in a solid state across the entire display region extending over all the pixels 3 as a common layer common to all the pixels 3. That is, the organic EL display device 1 according to the present embodiment has a configuration in which the blue fluorescent luminescent material containing layer 34FB is sandwiched by the blue phosphorescent luminescent material containing layer 34PB (the first phosphorescent luminescent material containing layer) and the blue phosphorescent luminescent material containing layer 34PB2 (the third phosphorescent luminescent material containing layer).

The blue phosphorescent luminescent material containing layer 34PB2 includes a blue phosphorescent luminescent material (the third phosphorescent luminescent material) for emitting blue phosphorescent light. A blue phosphorescent luminescent material having an HOMO level deeper than that of the blue fluorescent luminescent material in the blue fluorescent luminescent material containing layer 34FB is used for the blue phosphorescent luminescent material. Thereby, the blue phosphorescent luminescent material containing layer 34PB2 functions as a light-emitting layer of the blue pixel 3B and also functions as a hole blocking layer.

The above blue phosphorescent luminescent materials can be used for the blue phosphorescent luminescent material. Note that the blue phosphorescent luminescent material more desirably includes a blue TTA material.

In the present embodiment, each of the luminescent material containing layers 34 in the light-emitting layer unit 33 is also formed of two components having a host material and a luminescent material (a luminescent dopant material). A host material similar to the host material included in the blue phosphorescent luminescent material containing layer 34PB can be used for the host material included in the blue phosphorescent luminescent material containing layer 34PB2. However, in the present embodiment, each of the luminescent material containing layers 34 may be also formed of a luminescent material alone. Further, the material having the largest content percentage among the materials (components) in each of the luminescent material containing layers 34 may be a host material or a luminescent material.

The thickness of the blue phosphorescent luminescent material containing layer 34PB2 can be set to the same thickness as that of the blue phosphorescent luminescent material containing layer 34PB. However, the thickness of each layer between the reflective electrode 21a and the cathode electrode 23 is determined so that the distance between the reflective electrode 21a and the cathode electrode 23 is the optical path length at which the peak wavelength of the light of the color output from each pixel 3 resonates.

Manufacturing Method of Organic EL Display Device 1

A manufacturing process of the organic EL display device 1 according to the present embodiment is same as the manufacturing process of the organic EL display device 1 according to the first embodiment except for the point that the organic EL element preparation process includes a blue phosphorescent luminescent material containing layer formation process (the third fluorescent luminescent material containing layer formation process) for forming the blue phosphorescent luminescent material containing layer 34PB2 after the blue fluorescent luminescent material containing layer formation process.

The blue phosphorescent luminescent material containing layer formation process being the third phosphorescent luminescent material containing layer formation process is performed in continuation to the blue fluorescent luminescent material containing layer formation process so that the blue phosphorescent luminescent material containing layer 34PB2 is formed adjacently to the blue fluorescent luminescent material containing layer 34FB, between the blue fluorescent luminescent material containing layer 34FB and the cathode electrode 23.

The blue phosphorescent luminescent material containing layer 34PB2 is performed in the same way as the blue phosphorescent luminescent material containing layer formation process illustrated in FIG. 6C. That is, in the present embodiment, after the blue phosphorescent luminescent material containing layer formation process illustrated in FIG. 6C, the blue fluorescent luminescent material containing layer formation process illustrated in FIG. 6D is performed, and again, a blue phosphorescent luminescent material containing layer formation process similar to the blue phosphorescent luminescent material containing layer formation process illustrated in FIG. 6C is performed.

Thereafter, same as the first embodiment, the organic EL display device 1 illustrated in FIG. 10 can be manufactured by performing the electron transport layer formation process, the electron injection layer formation process, the cathode formation process, and the sealing step.

Light-Emission Method of Organic EL Display Device 1

According to the present embodiment, in the blue pixel 3B, excitons are generated in each of the blue phosphorescent luminescent material containing layer 34PB, the blue fluorescent luminescent material containing layer 34FB, and the blue phosphorescent luminescent material containing layer 34PB2. The light-emission principle of the blue phosphorescent luminescent material containing layer 34PB2 in the blue pixel 3B is same as the blue phosphorescent luminescent material containing layer 34PB in the blue pixel 3B. Further, the light-emission principle of the blue phosphorescent luminescent material containing layer 34PB and the blue fluorescent luminescent material containing layer 34FB in the blue pixel 3B, and the light-emission principle in the green pixel 3G and the red pixel 3R are same as that in the first and second embodiments.

The light output from the blue pixel 3B in the organic EL display device 1 according to the present embodiment includes at least the (i) blue phosphorescent light produced when the triplet excitons generated in the blue phosphorescent luminescent material containing layer 34PB return to the ground state ($S_0$), the (ii) blue fluorescent light produced when the singlet excitons generated in the blue fluorescent luminescent material containing layer 34FB return to the ground state ($S_0$), and the (iii) blue phosphorescent light produced when the triplet excitons generated in the blue phosphorescent luminescent material containing layer 34PB2 return to the ground state ($S_0$). In addition, in a case where at least one of the blue fluorescent luminescent material containing layer 34FB and the blue phosphorescent luminescent material containing layer 34PB2 includes a blue TTA material, and the thickness of the blue fluorescent luminescent material containing layer 34FB is within a range in which Dexter transfer occurs, then the light output from the blue pixel 3B includes, in addition to the light described in (i) to (iii), the blue fluorescent light produced when some of the energy of the triplet excitons generated in the blue phosphorescent luminescent material containing layer 34PB or the blue phosphorescent luminescent material containing layer 34PB2 is transferred to the triplet excitons generated in the blue fluorescent luminescent material containing layer 34FB by the Dexter mechanism, and the singlet excitons generated through up-conversion to singlet excitons from the triplet excitons generated in the blue fluorescent luminescent material containing layer 34FB return to the ground state through the TTA.

As described above, according to the present embodiment, the blue phosphorescent luminescent material containing layer 34PB2 functions as a light-emitting layer of the blue pixel 3B and also functions as a hole blocking layer. Therefore, according to the present embodiment, the blue phosphorescent luminescent material containing layer 34PB2 is provided to prevent a hole leakage without providing a hole blocking layer in the blue pixel 3B. Further, the blue phosphorescent luminescent material containing layer 34PB2 is provided to more easily adjust the balance between the luminous efficiency and the color level. Thus, the design of the display device conforming to the product characteristics becomes easier.

Supplement

An organic EL display device (1) according to a first aspect of the disclosure includes: a plurality of pixels including a first pixel (blue pixel 3B) configured to output blue light, and a second pixel (a green pixel 3G and/or a red pixel 3R) configured to output light having a peak wavelength longer than that of the blue light; and a first electrode (anode electrode 21), a second electrode (cathode electrode 23), and an organic layer (organic EL layer 22) including a light-emitting layer, the organic layer being formed between the first electrode and the second electrode, in each of the pixels. The first pixel includes, as the light-emitting layer, a first phosphorescent luminescent material containing layer (blue phosphorescent luminescent material containing layer 34PB) containing a first phosphorescent luminescent material for emitting blue phosphorescent light, and a first fluorescent luminescent material containing layer (blue fluorescent luminescent material containing layer 34FB) containing a first fluorescent luminescent material for emitting blue fluorescent light, the first fluorescent luminescent material containing layer being layered adjacently to the first phosphorescent luminescent material containing layer. The first phosphorescent luminescent material containing layer and the first fluorescent luminescent material containing layer are common layers provided in common to the plurality of pixels. The second pixel includes, as the light-emitting layer, a second phosphorescent luminescent material containing layer(a green phosphorescent luminescent material containing layer 34PG, or a red phosphorescent luminescent material containing layer 34RP) containing a second phosphorescent luminescent material for emitting phosphorescent light having a peak wavelength longer than that of the blue light, the second phosphorescent luminescent material containing layer being provided in each of the second pixel adjacently to the common layers at a first electrode side from the common layers. While each of the first phosphorescent luminescent material containing layer and the first fluorescent luminescent material containing layer emits light in the first pixel, the second phosphorescent luminescent material containing layer emits light in the second pixel.

According to the organic EL display device of a second aspect of the disclosure, in the first aspect, light including phosphorescent light produced when triplet excitons generated in the first phosphorescent luminescent material containing layer return to a ground state, and fluorescent light produced when singlet excitons generated in the first fluorescent luminescent material containing layer return to a ground state may be output in the first pixel, and phosphorescent light produced when triplet excitons generated in the second phosphorescent luminescent material containing layer return to a ground state may be output in the second pixel.

According to the organic EL display device of a third aspect of the disclosure, in the second aspect, the first fluorescent luminescent material may include a delayed fluorescent luminescent material for generating a singlet exciton from a triplet exciton through a Triplet-Triplet Annihilation phenomenon, a triplet excitation level of the first phosphorescent luminescent material may be higher than a triplet excitation level of the delayed fluorescent luminescent material, a thickness of the first fluorescent luminescent material containing layer may be within a range in which energy transfer occurs by a Dexter mechanism, and the light output from the first pixel may further include fluorescent light produced when some of energy of the triplet excitons generated in the first phosphorescent luminescent material containing layer is transferred to triplet excitons generated in the first fluorescent luminescent material containing layer by the Dexter mechanism, and singlet excitons generated through up-conversion to the singlet excitons from the triplet excitons generated in the first fluorescent luminescent material containing layer through the Triplet-Triplet Annihilation phenomenon return to a ground state.

According to the organic EL display device of a fourth aspect of the disclosure, in any one of the first to third aspects, the first electrode may be an anode electrode, the second electrode may be a cathode electrode, and a material included in a layer at the first electrode side out of the common layers may have an HOMO level deeper than the second phosphorescent luminescent material.

According to the organic EL display device of a fifth aspect of the disclosure, in the fourth aspect, a triplet excitation level of the luminescent material included in the layer at the first electrode side out of the common layers may be higher than a triplet excitation level of the second phosphorescent luminescent material.

According to the organic EL display device of a sixth aspect of the disclosure, in the fourth or fifth aspect, a layer at a side of the second electrode out of the common layers includes a material having an HOMO level shallower than the layer at the first electrode side while including a material having a LUMO level shallower than the layer at the first electrode side.

According to the organic EL display device of a seventh aspect of the disclosure, in any one of the fourth to sixth aspects, the layer at the first electrode side out of the common layers may include a hole transport material, or a bipolar transport material including a hole transport material and an electron transporting material, and a layer at the second electrode side out of the common layers may include an electron transporting material.

According to the organic EL display device of an eighth aspect of the disclosure, in the sixth or seventh aspect, the organic layer in the first pixel may include a hole blocking layer (37) adjacent to the common layers, between the common layers and the second electrode.

According to the organic EL display device of a ninth aspect of the disclosure, in any one of the first to eighth aspects, the first phosphorescent luminescent material containing layer and the first fluorescent luminescent material containing layer may be layered in this order from the first electrode side.

According to the organic EL display device of a tenth aspect of the disclosure, in the ninth aspect, a third phosphorescent luminescent material containing layer (blue phosphorescent light-emitting containing layer 34PB2) including a third phosphorescent luminescent material for emitting blue phosphorescent light may be provided between the first fluorescent luminescent material containing layer and the second electrode in the plurality of pixels, adjacently to the first fluorescent luminescent material containing layer, as a common layer common to the plurality of pixels, and in the first pixel, each of the first phosphorescent luminescent material containing layer, the first fluorescent luminescent material containing layer, and the third phosphorescent luminescent material containing layer emits light, and the light output from the first pixel may further include light produced when the triplet excitons generated in the third phosphorescent luminescent material containing layer return to a ground state, and the material included in the third phosphorescent luminescent material containing layer may have an HOMO level deeper than that of the first fluorescent luminescent material.

According to the organic EL display device of an eleventh aspect of the disclosure, in any one of the first to tenth aspects, one electrode of the first electrode and the second electrode has a reflective layer (reflective electrode 21a), and the other electrode has a transreflective layer, and the distance between the reflective layer and the transreflective layer may be an optical path length at which the peak wavelength of light having a color output from each pixel resonates.

A method of manufacturing an organic EL display device (1) according to a twelfth aspect of the disclosure is provided. The organic EL display device includes: a plurality of pixels including a first pixel (blue pixel 3B) configured to emit blue light, and a second pixel (a green pixel 3G or a red pixel 3R) configured to emit light having a peak wavelength longer than that of the blue light; and a first electrode (anode electrode 21), a second electrode (cathode electrode 23), and an organic layer (organic EL layer 22) including a light-emitting layer, the organic layer being formed between the first electrode and the second electrode in each of the pixels. The first pixel includes, as the light-emitting layer, a first phosphorescent luminescent material containing layer (blue phosphorescent luminescent material containing layer 34PB) including a first phosphorescent luminescent material for emitting blue phosphorescent light, and a first fluorescent luminescent material containing layer (blue fluorescent luminescent material containing layer 34FB) including a first fluorescent luminescent material for emitting blue fluorescent light, the first fluorescent luminescent material containing layer being layered adjacently to the first phosphorescent luminescent material containing layer. The first phosphorescent luminescent material containing layer and the first fluorescent luminescent material containing layer are common layers provided in common to the plurality of pixels. The second pixel includes, as the light-emitting layer, a second phosphorescent luminescent material containing layer (a green phosphorescent luminescent material containing layer 34PG, or a red phosphorescent luminescent material containing layer 34PR) including a second phosphorescent luminescent material for emitting phosphorescent light having a peak wavelength longer than that of the blue light, the second phosphorescent luminescent material containing layer being provided in each of the second pixel adjacently to the common layers at a first electrode side from the common layers, and while each of the first phosphorescent luminescent material containing layer and the first fluorescent luminescent material containing layer emits light in the first pixel, the second phosphorescent luminescent material containing layer emits light in the second pixel. The method of manufacturing an organic EL display device further includes a first electrode formation process for forming the first electrode, an organic layer formation process for forming the organic layer, and a second electrode formation process for forming the second electrode. The organic layer formation process includes a second phosphorescent luminescent material containing layer formation process for forming the second phosphorescent luminescent material containing layer in the second pixel by using a vapor deposition mask (a vapor deposition mask 200G or a vapor deposition mask 200R) provided with a mask opening (a mask opening 201G or a mask opening 201R) corresponding to the second pixel, and a common layer formation process for forming the common layers by using a vapor deposition mask (a vapor deposition mask 200B1 or a vapor deposition mask 200B2) having a mask opening (a mask opening 201B1 or a mask opening 201B2) common to the plurality of pixels. The common layer formation process includes a first phosphorescent luminescent material containing layer formation process for forming the first phosphorescent luminescent material containing layer, and a first fluorescent luminescent material containing layer formation process for forming the first fluorescent luminescent material containing layer, the second phosphorescent luminescent material containing layer formation process and the common layer formation process are performed in continuation so that the common layers are formed adjacently to the second phosphorescent luminescent material containing layer at the second electrode side from the second phosphorescent luminescent material containing layer, while the first phosphorescent luminescent material containing layer formation process and the first fluorescent luminescent material containing layer formation process are performed in continuation so that the first phosphorescent luminescent material containing layer and the first fluorescent luminescent material containing layer are adjacently layered.

According to the method of manufacturing an organic EL display device of a thirteenth aspect of the disclosure, in the twelfth aspect, the processes may be performed in continuation so that the first phosphorescent luminescent material containing layer and the first fluorescent luminescent material containing layer are layered in this order from the first electrode side.

According to the method of manufacturing an organic EL display device of a fourteenth aspect of the disclosure, in the twelfth or thirteenth aspect, the first electrode may be an anode electrode, the second electrode may be a cathode electrode, the organic layer formation process may include a hole blocking layer formation process for forming a hole blocking layer (37) adjacent to the common layers in the first pixel, the hole blocking layer formation process may be performed between the common layer formation process and the second electrode formation process while the common layer formation process and the hole blocking layer formation process may be performed in continuation so that the common layers and the hole blocking layer are layered adjacently to each other.

According to the method of manufacturing an organic EL display device of a fifteenth aspect of the disclosure, in the thirteenth aspect, the first electrode may be an anode electrode, the second electrode may be a cathode electrode, the common layer formation process may further include a third phosphorescent luminescent material containing layer formation process for forming a third phosphorescent luminescent material containing layer (blue phosphorescent luminescent material container layer 34PB2) including a third phosphorescent luminescent material for emitting blue phosphorescent light, and a material having an HOMO level deeper than that of the first fluorescent luminescent material, and the first fluorescent luminescent material containing layer formation process and the third phosphorescent luminescent material containing layer formation process may be performed in continuation so that the third phosphorescent luminescent material containing layer is formed adjacently to the first fluorescent luminescent material containing layer, between the first fluorescent luminescent material containing layer and the second electrode.

A method of light emission of an organic EL display device (1) according to a sixteenth aspect of the disclosure is provided. The organic EL display device includes: a plurality of pixels including a first pixel (blue pixel 3B) configured to output blue light, and a second pixel (a green pixel 3G, or a red pixel 3R) configured to output light having a peak wavelength longer than that of the blue light; and a first electrode (anode electrode 21), a second electrode (cathode electrode 23), and an organic layer (organic EL layer 22) including a light-emitting layer, the organic layer being formed between the first electrode and the second electrode, in each of the pixels. The first pixel includes, as the light-emitting layer, a first phosphorescent luminescent material containing layer (blue phosphorescent luminescent material containing layer 34PB) including a first phosphorescent luminescent material for emitting blue phosphorescent light, and a first fluorescent luminescent material containing layer (blue fluorescent luminescent material containing layer 34FB) including a first fluorescent luminescent material for emitting blue fluorescent light, the first fluorescent luminescent material containing layer being layered adjacently to the first phosphorescent luminescent material containing layer. The first phosphorescent luminescent material containing layer and the first fluorescent luminescent material containing layer are common layers provided in common to the plurality of pixels. The second pixel includes, as the light-emitting layer, a second phosphorescent luminescent material containing layer (a green phosphorescent luminescent material containing layer 34PG, or a red phosphorescent luminescent material containing layer 34PR) including a second phosphorescent luminescent material for emitting phosphorescent light having a peak wavelength longer than that of blue light, the second phosphorescent luminescent material containing layer being provided in each of the second pixel adjacently to the common layers at a first electrode side from the common layers. The first electrode is an anode electrode, the second electrode is a cathode. In the first pixel, a triplet exciton is generated in the first phosphorescent luminescent material containing layer while a singlet exciton is generated in the first fluorescent luminescent material containing layer. Light containing light produced when the triplet exciton generated in the first phosphorescent luminescent material containing layer returns to a ground state, and light produced when the singlet exciton generated in the first fluorescent luminescent material containing layer returns to a ground state is emitted. In the second pixel, a triplet exciton is generated in the second phosphorescent luminescent material containing layer, phosphorescent light produced when the triplet exciton generated in the second phosphorescent luminescent material containing layer returns to a ground state is emitted while, by using a material having an HOMO level deeper than that of the second phosphorescent luminescent material in the material included in the layer at the first electrode side among the common layers, movement of a hole from the second phosphorescent luminescent material containing layer to the common layers is blocked.

According to the light emission method of an organic EL display device of the seventeenth aspect of the disclosure, in the first pixel, fluorescent light produced when some of energy of the triplet excitons generated in the first phosphorescent luminescent material containing layer is transferred to triplet excitons generated in the first fluorescent luminescent material containing layer by a Dexter mechanism, and singlet excitons generated through up-conversion to singlet excitons from the triplet excitons generated in the first fluorescent luminescent material containing layer through a Triplet-Triplet Annihilation phenomenon return to a ground state may be further emitted.

REFERENCE SIGNS LIST

1 Organic EL display device
3B Blue pixel (first pixel)
3G Green pixel (second pixel)
3R Red pixel (second pixel)
20B Blue organic EL element
20G Green organic EL element
20R Red organic EL element
21 Anode electrode (first electrode)
21a Reflective electrode (reflective layer)
21b Light-transmissive electrode
22 Organic EL layer (organic layer)
23 Cathode electrode (second electrode)
24 Edge cover
33 Light-emitting layer unit
34FB Blue fluorescent luminescent material containing layer (first fluorescent luminescent material containing layer)
34PB Blue phosphorescent luminescent material containing layer (first phosphorescent luminescent material containing layer)
34PB2 Blue phosphorescent luminescent material containing layer (third phosphorescent luminescent material containing layer)
34PG Green phosphorescent luminescent material containing layer
34PR Red phosphorescent luminescent material containing layer
37 Hole blocking layer
200B1, 200B2, 200G, 200HB, 200R, 200R, 200R/200G/200B1/200B2 Vapor deposition mask
201B1, 201B2, 201G, 201HB, 201R Mask opening

The invention claimed is:

1. An organic EL display device, comprising:
a plurality of pixels including a first pixel configured to output blue light, and a second pixel configured to output light having a peak wavelength longer than that of the blue light; and
a first electrode, a second electrode, and an organic layer including a light-emitting layer, the organic layer being formed between the first electrode and the second electrode, in each of the pixels,
wherein the first pixel includes, as the light-emitting layer, a first phosphorescent luminescent material containing layer including a first phosphorescent luminescent material for emitting blue phosphorescent light, and a first fluorescent luminescent material containing layer including a first fluorescent luminescent material for emitting blue fluorescent light, the first fluorescent luminescent material containing layer being layered adjacently to the first phosphorescent luminescent material containing layer,
the first phosphorescent luminescent material containing layer and the first fluorescent luminescent material containing layer are common layers provided in common to the plurality of pixels,
the second pixel includes, as the light-emitting layer, a second phosphorescent luminescent material containing layer including a second phosphorescent luminescent material for emitting phosphorescent light having a peak wavelength longer than that of the blue light, the second phosphorescent luminescent material containing layer being provided in each of the second pixel adjacently to the common layers at a first electrode side from the common layers, and
while each of the first phosphorescent luminescent material containing layer and the first fluorescent luminescent material containing layer emits light in the first pixel, the second phosphorescent luminescent material containing layer emits light in the second pixel.

2. The organic EL display device according to claim 1,
wherein light including phosphorescent light produced when triplet excitons generated in the first phosphorescent luminescent material containing layer return to a ground state, and fluorescent light produced when singlet excitons generated in the first fluorescent luminescent material containing layer return to a ground state is output in the first pixel, and
phosphorescent light produced when triplet excitons generated in the second phosphorescent luminescent material containing layer return to a ground state is output in the second pixel.

3. The organic EL display device according to claim 2,
wherein the first fluorescent luminescent material includes a delayed fluorescent luminescent material for generating a singlet exciton from a triplet exciton through a Triplet-Triplet Annihilation phenomenon,
a triplet excitation level of the first phosphorescent luminescent material is higher than a triplet excitation level of the delayed fluorescent luminescent material,
a thickness of the first fluorescent luminescent material containing layer is within a range in which energy transfer occurs by a Dexter mechanism, and
the light output from the first pixel further includes fluorescent light produced when some of energy of the triplet excitons generated in the first phosphorescent luminescent material containing layer is transferred to triplet excitons generated in the first fluorescent luminescent material containing layer by the Dexter mechanism, and singlet excitons generated through up-conversion to the singlet excitons from the triplet excitons generated in the first fluorescent luminescent material containing layer return to a ground state through the Triplet-Triplet Annihilation phenomenon.

4. The organic EL display device according to claim 1,
wherein the first electrode is an anode electrode, the second electrode is a cathode electrode, and a material included in a layer at the first electrode side out of the common layers has an HOMO level deeper than the second phosphorescent luminescent material.

5. The organic EL display device according to claim 4,
wherein a triplet excitation level of the luminescent material included in the layer at the first electrode side out of the common layers is higher than a triplet excitation level of the second phosphorescent luminescent material.

6. The organic EL display device according to claim 4,
wherein a layer at a side of the second electrode out of the common layers includes a material having an HOMO level shallower than the layer at the first electrode side while including a material having a LUMO level shallower than the layer at the first electrode side.

7. The organic EL display device according to claim 4,
wherein the layer at the first electrode side out of the common layers includes a hole transport material, or a bipolar transport material including a hole transport material and an electron transporting material, and
a layer at the second electrode side out of the common layers includes an electron transporting material.

8. The organic EL display device according to claim 6,
wherein the organic layer in the first pixel includes a hole blocking layer adjacent to the common layers, between the common layers and the second electrode.

9. The organic EL display device according to claim 1,
wherein the first phosphorescent luminescent material containing layer and the first fluorescent luminescent material containing layer are layered in this order from the first electrode side.

10. The organic EL display device according to claim 9,
wherein a third phosphorescent luminescent material containing layer including a third phosphorescent luminescent material for emitting blue phosphorescent light is provided between the first fluorescent luminescent material containing layer and the second electrode in the plurality of pixels, adjacently to the first fluorescent luminescent material containing layer, as a common layer common to the plurality of pixels,
in the first pixel, each of the first phosphorescent luminescent material containing layer, the first fluorescent luminescent material containing layer, and
the third phosphorescent luminescent material containing layer emits light, and the light output from the first pixel further includes light produced when triplet excitons generated in the third phosphorescent luminescent material containing layer return to a ground state, while
the material included in the third phosphorescent luminescent material containing layer has an HOMO level deeper than that of the first fluorescent luminescent material.

11. The organic EL display device according to claim 1,
wherein one electrode of the first electrode and the second electrode has a reflective layer, and the other electrode has a transreflective layer, and
a distance between the reflective layer and the transreflective layer is an optical path length at which a peak wavelength of light having a color output from each pixel resonates.

12. A method of manufacturing an organic EL display device, the organic EL display device comprising:
a plurality of pixels including a first pixel configured to emit blue light, and a second pixel configured to emit light having a peak wavelength longer than that of the blue light; and
a first electrode, a second electrode, and an organic layer including a light-emitting layer, the organic layer being formed between the first electrode and the second electrode, in each of the pixels,
wherein the first pixel includes, as the light-emitting layer, a first phosphorescent luminescent material containing layer including a first phosphorescent luminescent material for emitting blue phosphorescent light, and a first fluorescent luminescent material containing layer including a first fluorescent luminescent material for emitting blue fluorescent light, the first fluorescent luminescent material containing layer being layered adjacently to the first phosphorescent luminescent material containing layer,
the first phosphorescent luminescent material containing layer and the first fluorescent luminescent material containing layer are common layers provided in common to the plurality of pixels,
the second pixel includes, as the light-emitting layer, a second phosphorescent luminescent material containing layer including a second phosphorescent luminescent material for emitting phosphorescent light having a peak wavelength longer than that of the blue light, the second phosphorescent luminescent material containing layer being provided in each of the second pixel adjacently to the common layers at a first electrode side from the common layers, and while each of the first phosphorescent luminescent material containing layer and the first fluorescent luminescent material containing layer emits light in the first pixel, the second phosphorescent luminescent material containing layer emits light in the second pixel,
the method comprising:
a first electrode formation process for forming the first electrode;
an organic layer formation process for forming the organic layer; and
a second electrode formation process for forming the second electrode,
wherein the organic layer formation process includes a second phosphorescent luminescent material containing layer formation process for forming the second phosphorescent luminescent material containing layer in the second pixel by using a vapor deposition mask provided with a mask opening corresponding to the second pixel, and a common layer formation process for forming the common layers by using a vapor deposition mask having a mask opening common to the plurality of pixels,
the common layer formation process includes a first phosphorescent luminescent material containing layer formation process for forming the first phosphorescent luminescent material containing layer, and a first fluorescent luminescent material containing layer formation process for forming the first fluorescent luminescent material containing layer, and
the second phosphorescent luminescent material containing layer formation process and the common layer formation process are performed in continuation to form the common layers adjacently to the second phosphorescent luminescent material containing layer at a second electrode side from the second phosphorescent luminescent material containing layer, while
the first phosphorescent luminescent material containing layer formation process and the first fluorescent luminescent material containing layer formation process are performed in continuation to layer the first phosphorescent luminescent material containing layer and the first fluorescent luminescent material containing layer adjacently.

13. The method of manufacturing an organic EL display device according to claim 12,
wherein the processes are performed in continuation to layer the first phosphorescent luminescent material containing layer and the first fluorescent luminescent material containing layer in this order from the first electrode side.

14. The method of manufacturing an organic EL display device according to claim 12,
wherein the first electrode is an anode electrode, the second electrode is a cathode electrode,
the organic layer formation process includes a hole blocking layer formation process for forming a hole blocking layer adjacently to the common layers in the first pixel, and
the hole blocking layer formation process is performed between the common layer formation process and the second electrode formation process, while
the common layer formation process and the hole blocking layer formation process are performed in continuation to layer the common layer and the hole blocking layer adjacently to each other.

15. The method of manufacturing an organic EL display device according to claim 13,
wherein the first electrode is an anode electrode, the second electrode is a cathode electrode,
the common layer formation process further includes a third phosphorescent luminescent material containing layer formation process for forming a third phosphorescent luminescent material containing layer including a third phosphorescent luminescent material for emitting blue phosphorescent light as well as a material having an HOMO level deeper than that of the first fluorescent luminescent material, and
the first fluorescent luminescent material containing layer formation process and the third phosphorescent luminescent material containing layer formation process are performed in continuation to form the third phosphorescent luminescent material containing layer adjacently to the first fluorescent luminescent material containing layer, between the first fluorescent luminescent material containing layer and the second electrode.

16. A method of light emission of an organic EL display device, the organic EL display device comprising:
a plurality of pixels including a first pixel configured to output blue light, and a second pixel configured to output light having a peak wavelength longer than that of the blue light; and
a first electrode, a second electrode, and an organic layer including a light-emitting layer, the organic layer being formed between the first electrode and the second electrode, in each of the pixels,
wherein the first pixel includes, as the light-emitting layer, a first phosphorescent luminescent material containing layer including a first phosphorescent luminescent material for emitting blue phosphorescent light, and a first fluorescent luminescent material containing layer including a first fluorescent luminescent material for emitting blue fluorescent light, the first fluorescent luminescent material containing layer being layered adjacently to the first phosphorescent luminescent material containing layer,
the first phosphorescent luminescent material containing layer and the first fluorescent luminescent material containing layer are common layers provided in common to the plurality of pixels, and
the second pixel includes, as the light-emitting layer, a second phosphorescent luminescent material containing layer including a second phosphorescent luminescent material for emitting phosphorescent light having a peak wavelength longer than that of the blue light, the second phosphorescent luminescent material containing layer being provided in each of the second pixel adjacently to the common layers at a first electrode side from the common layers,
the method, wherein the first electrode is an anode electrode, and the second electrode is a cathode electrode,
in the first pixel, a triplet exciton is generated in the first phosphorescent luminescent material containing layer while a singlet exciton is generated in the first fluorescent luminescent material containing layer, and light containing light produced when the triplet exciton generated in the first phosphorescent luminescent material containing layer returns to a ground state, and light produced when the singlet exciton generated in the first fluorescent luminescent material containing layer returns to a ground state is emitted, and
in the second pixel, a triplet exciton is generated in the second phosphorescent luminescent material containing layer, and phosphorescent light produced when the triplet exciton generated in the second phosphorescent luminescent material containing layer returns to a ground state is emitted, while by using a material having an HOMO level deeper than that of the second phosphorescent luminescent material in the material included in the layer at the first electrode side among the common layers, movement of a hole from the second phosphorescent luminescent material containing layer to the common layers is blocked.

17. The light emission method of an organic EL display device according to claim 16, wherein in the first pixel, fluorescent light produced when some of energy of the triplet excitons generated in the first phosphorescent luminescent material containing layer is transferred to triplet excitons generated in the first fluorescent luminescent material containing layer by a Dexter mechanism, and singlet excitons generated through up-conversion to the singlet excitons from the triplet excitons generated in the first fluorescent luminescent material containing layer through a Triplet-Triplet Annihilation phenomenon return to a ground state is further emitted.

\* \* \* \* \*